US006207077B1

(12) United States Patent
Burnell-Jones

(10) Patent No.: US 6,207,077 B1
(45) Date of Patent: Mar. 27, 2001

(54) LUMINESCENT GEL COATS AND MOLDABLE RESINS

(75) Inventor: Peter Burnell-Jones, Burleigh Gardens (AU)

(73) Assignee: Orion 21 A.D. PTY LTD, Brisbane (AU)

( * ) Notice: Subject to any disclaimer, the term of this patent is extended or adjusted under 35 U.S.C. 154(b) by 0 days.

(21) Appl. No.: 09/170,432

(22) Filed: Oct. 13, 1998

(51) Int. Cl.$^7$ .................................................. C09K 11/02
(52) U.S. Cl. .................... 252/301.36; 428/690; 523/514; 523/521; 523/526; 525/15; 525/23; 525/12; 524/403; 524/418; 524/420; 524/423; 524/427; 524/437; 524/442; 524/449; 524/786; 524/787; 524/783
(58) Field of Search ................... 252/301.36, 301.33, 252/301.4 K, 301.65; 523/514, 521, 526; 525/15, 12, 23; 524/403.468, 420, 423, 425, 427, 437, 442, 447, 786, 787, 783; 428/690

(56) References Cited

U.S. PATENT DOCUMENTS

| | | |
|---|---|---|
| 2,623,857 | 12/1952 | Kroger . |
| 2,623,858 | 12/1952 | Kroger . |
| 3,595,804 | 7/1971 | Martin, Jr. . |
| 3,740,616 | 6/1973 | Suzuki et al. . |
| 3,936,970 | 2/1976 | Hodges . |
| 3,952,690 | 4/1976 | Rizzo et al. . |
| 3,957,678 | 5/1976 | Dikhoff et al. . |
| 3,970,582 | 7/1976 | Fan et al. . |
| 4,084,114 | 4/1978 | Kuroda et al. . |
| 4,088,710 | 5/1978 | Spak et al. . |
| 4,210,953 | 7/1980 | Stone . |
| 4,211,686 * | 7/1980 | Nishikawa et al. ................... 524/403 |
| 4,211,813 | 7/1980 | Gravisse et al. . |
| 4,231,892 | 11/1980 | Chang et al. . |
| 4,290,938 * | 9/1981 | Miyake et al. ........................ 524/403 |
| 4,314,036 | 2/1982 | Throne et al. . |
| 4,369,224 | 1/1983 | Cordts et al. . |
| 4,527,096 | 7/1985 | Kindlmann . |
| 4,540,451 | 9/1985 | Leibenzeder et al. . |
| 4,629,583 | 12/1986 | Goguen . |
| 4,665,342 | 5/1987 | Topp et al. . |
| 4,742,121 | 5/1988 | Toman . |
| 4,759,453 | 7/1988 | Paetzold . |
| 4,775,964 | 10/1988 | Alessio et al. . |
| 4,916,023 | 4/1990 | Kawabata et al. . |
| 4,916,360 | 4/1990 | Mikami et al. . |
| 4,965,091 | 10/1990 | Fratello et al. . |
| 4,967,251 | 10/1990 | Tanaka et al. . |
| 4,975,338 | 12/1990 | Kageyama et al. . |
| 4,980,086 | 12/1990 | Hiraiwa et al. . |
| 5,080,928 | 1/1992 | Klinedinst et al. . |
| 5,087,405 | 2/1992 | Maker . |
| 5,135,591 | 8/1992 | Vockel, Jr. et al. . |
| 5,152,229 | 10/1992 | Nimmo . |
| 5,223,330 | 6/1993 | Vockel, Jr. et al. . |
| 5,306,441 | 4/1994 | Reddy et al. . |
| 5,310,504 | 5/1994 | Ihm et al. . |
| 5,314,953 | 5/1994 | Corcoran et al. . |
| 5,322,707 | 6/1994 | Ihm et al. . |
| 5,324,757 | 6/1994 | Ohkawa et al. . |
| 5,395,673 | 3/1995 | Hunt . |
| 5,401,827 | 3/1995 | Holmes et al. . |
| 5,412,544 | 5/1995 | Derrick et al. . |
| 5,424,006 | 6/1995 | Murayama et al. . |
| 5,439,957 * | 8/1995 | Takimoto et al. ................... 524/101 |
| 5,489,398 | 2/1996 | Reddy et al. . |
| 5,490,344 | 2/1996 | Bussiere . |
| 5,531,926 | 7/1996 | Qi et al. . |
| 5,531,928 | 7/1996 | Karam et al. . |
| 5,558,817 | 9/1996 | Bredol et al. . |
| 5,567,352 | 10/1996 | Qi et al. . |
| 5,569,530 | 10/1996 | Dooms et al. . |
| 5,582,768 | 12/1996 | Reddy et al. . |
| 5,601,049 | 2/1997 | Hordis et al. . |
| 5,605,734 | 2/1997 | Yeh . |
| 5,607,621 | 3/1997 | Ishihara et al. . |
| 5,674,437 | 10/1997 | Geisel . |
| 5,692,895 | 12/1997 | Farzin-Nia et al. . |
| 5,698,301 | 12/1997 | Yonetani . |
| 5,716,723 | 2/1998 | Van Cleef et al. . |
| 5,744,233 | 4/1998 | Opitz et al. . |

\* cited by examiner

*Primary Examiner*—C. Melissa Koslow
(74) *Attorney, Agent, or Firm*—William R. Hyde

(57) ABSTRACT

Luminescent polymers are prepared from thermosetting unsaturated polyesters, suspending fillers and phosphorescent pigments and utilized to make gel coated articles and molded, cast and fiberglass reinforced plastic (FRP) articles. The luminescent polymers show bright and long-lasting photoluminescent afterglow, strong thermostimulation of afterglow by heat and electroluminescent properties. The preferred thermosetting unsaturated polyester resins are prepared by condensing mixtures of ethylenically unsaturated and aromatic dicarboxylic acids and anhydrides with dihydric alcohols and a polymerizable vinylidene monomer. Phthalic (orthophthalic) and isophthalic aromatic modified polyesters and their substituted derivatives are preferred, particularly those formed from maleate or fumarate unsaturated dicarboxylic acids and anhydrides and a glycol or mixtures of glycols. The preferred monomer is styrene. Preferred suspending fillers and thixotropic modifiers include silica, microspheres, glass fibers and other short fibers, nepheline syenite, feldspar, mica, pumice, magnesium sulfate, calcium carbonate, bentonite and the various clays and thixotropic modifiers and mixtures thereof. Preferred phosphorescent pigments include alkaline earth aluminate phosphors, zinc sulfide phosphors and mixtures of these phosphors. The luminescent resins may be rendered fire retardant and made flexible. As the heavy phosphorescent pigments remain in suspension, the raw luminescent resins are suitable for long-term storage and use.

23 Claims, No Drawings

LUMINESCENT GEL COATS AND MOLDABLE RESINS

BACKGROUND OF THE INVENTION

1. Field of the Invention

The present invention relates to luminescent synthetic polymers. More particularly, the invention relates to photoluminescent, thermoluminescent and electroluminescent polymer blends useful as gel coats and as moldable resins.

2. Description of Related Art

The term "luminescenz" was first used in 1888 by Eilhardt Wiedemann, German physicist and historian of science, for "all those phenomena of light which are not solely conditioned by the rise in temperature." By the rise in temperature, Wiedemann referred to the fact that liquids and solids emit more and more radiation of shorter and shorter wavelengths as their temperature increases, finally becoming perceptible to the eye as the material becomes red hot and then white hot. This is incandescence or "hot light," in contrast to luminescence or "cold light."

Examples of luminescence are the dim glow of phosphorus (a chemiluminescence), the phosphorescence of certain solids (phosphors) after exposure to sunlight, X-rays or electron beams, the transitory fluorescence of many substances when excited by exposure to various kinds of radiation, the aurora borealis and the electroluminescence of gases when carrying a current, the triboluminescence of crystals when rubbed or broken, the bioluminescence of many organisms, including the firefly, the glowworm and the "burning of the sea," the fungus light of decaying tree trunks, and the bacterial light of dead flesh or fish.

For centuries incandescence was the universal method of artificial illumination: the torch, candle, oil lamp, gas lamp and tungsten filament served to light the way. There remains a need for a useful, renewable cold light source, particularly for photoluminescent materials which will absorb light and then emit useful amounts of light over long periods, thermoluminescent materials in which the photoluminescence is activated by heat and electroluminescent materials in which the light output is in response to electrical current.

Phosphorescent pigments are those in which excitation by a particular wavelength of visible or ultraviolet radiation results in the emission of light lasting beyond the excitation. After cessation of luminescence and renewed exposure to light, the material again absorbs light energy and exhibits the glow-in-the-dark property (an absorbing-accumulating-emitting cycle). Most phosphorescent pigments suffer from the problems of low luminescence and/or short afterglow.

Various phosphorescent substances are known, including sulfides, metal aluminate oxides, silicates and various rare earth compounds (particularly rare earth oxides). The most common type of phosphorescent pigment is zinc sulfide structure with substitution of the zinc and activation by various elemental activators. It is known that many luminescent materials may be prepared by incorporating metallic zinc sulfide (which emits green light). Moreover, with zinc sulfide a material or mixtures of materials variously termed activators, coactivators or compensators are usually employed. Known activators include such elements as copper (forming ZnS:Cu, probably the most common zinc sulfide phosphor), aluminum, silver, gold, manganese, gallium, indium, scandium, lead, cerium, terbium, europium, gadolinium, samarium, praseodymium or other rare earth elements and halogens. These activators presumably enter the crystal lattice of the host material and are responsible for imparting the luminescent properties to the material. Other sulfide phosphors which emit various colors of light include ZnCdS:Cu and ZnCdS:Ag, CaS:Bi, CaSrS:Bi, alpha barium-zinc sulfides, barium-zinc-cadmium sulfides, strontium sulfides, etc. The other important class of long-life phosphorescent pigments is the metal aluminates, particularly the alkaline earth aluminate oxides, of formula $MAl_2O_4$ where M is a metal or mixture of metals. Examples are strontium aluminum oxide ($SrAl_2O_4$), calcium aluminum oxide ($CaAl_2O_4$), barium aluminum oxide ($BaAl_2O_4$) and mixtures. These aluminate phosphors, with or without added magnesium, may be further activated with other metals and rare earths.

For example, U.S. Pat. No. 5,558,817 (1996) to Bredol et al. discloses a method of manufacturing luminescent zinc sulfide of cubic structure activated by copper and aluminum, forming a material having a high x-value of the color point as well as a high luminous efficacy in conjunction with a simple manufacture. U.S. Pat. No. 3,595,804 (1971) to Martin, Jr. discloses a method for preparing zinc sulfide and zinc-cadmium sulfide phosphors containing aluminum and activated with silver or copper. U.S. Pat. No. 3,957,678 (1976) to Dikhoff et al. discloses a method of manufacturing a luminescent sulfide of zinc and/or cadmium. The luminescent sulfide may be self-activated or activated by silver, copper and/or gold and coactivated by aluminum, gallium, indium, scandium and/or the rare earths. U.S. Pat. No. 3,970,582 (1976) to Fan et al. discloses luminescent materials comprising alpha barium zinc sulfides or barium zinc cadmium sulfides activated with manganese, europium, cerium, lead or terbium and methods for making the phosphors.

Alkaline earth metal aluminate oxide phosphors and their preparation are discussed in U.S. Pat. No. 5,424,006 to Murayama et al. Alkaline earth aluminum oxide phosphors of formula $MAl_2O_4$ were prepared where M was selected from calcium, strontium, barium or mixtures thereof, with or without added magnesium. The phosphorescent aluminates were activated with europium and co-activated with lanthanum, cerium, praseodymium, neodymium, samarium, gadolinium, dysprosium, holmium, erbium, thulium, ytterbium, lutetium, tin, bismuth or mixtures thereof. These metal aluminate phosphors have a bright and long-lasting photoluminescent afterglow and show a glow peak of thermoluminescence in a high-temperature region of 50° C. or above when irradiated by ultraviolet or visible rays having a wavelength of 200 to 450 nm at room temperatures.

The alkaline earth metal type aluminate phosphors of Murayama et al. were developed in response to the problems with zinc sulfide phosphors decomposing as the result of irradiation by ultraviolet (UV) radiation in the presence of moisture (thus making it difficult to use zinc sulfide phosphors in fields where it is placed outdoors and exposed to direct sunlight) and problems of insufficient length of afterglow (necessitating doping a radioactive substance to the phosphorescent phosphor and employing a self-luminous paint which keeps emitting light by absorbing radiation energy for items such as luminous clocks). The metal aluminate phosphors such as activated alkaline earth aluminate oxides exhibit UV insensitivity and bright and long-lasting afterglow luminance. However, metal aluminate phosphors may be at a disadvantage compared to zinc sulfide phosphors in requiring a considerably long time and/or more intense illumination for excitation to attain saturation of afterglow luminance and vulnerability to water and moisture. This points out is the need for adaptation of specific phosphors and mixtures of phosphors for use in varying excitation conditions, a need for water-resistant formulations suitable for protecting phosphorescent particles and a need for UV protection where sulfides are utilized.

Phosphorescent materials have found use in a variety of commercial applications including warning signs, machinery marking, dial illumination, directional signs, marking the edge of steps, fire helmets, accident prevention, protective clothing, sports equipment, etc. Commercially available sheets of phosphorescent material are typically phosphorescent pigment in clear polyvinylchloride. Other approaches are also utilized, usually involving thermoplastics (which may be repeatedly softened by heating and hardened by cooling) or elastomeric and rubbery materials.

For example, U.S. Pat. No. 4,211,813 (1980) to Gravisse et al. discloses photoluminescent textile and other flexible sheet materials coated with a thin film of photoluminescent synthetic resin. A textile material was coated with a synthetic resin containing a phosphorescent metal sulphide and a substance which absorbs energy of short wave-length and emits energy at wave-lengths which lie within the absorption spectrum of the phosphorescent constituent. Preferred resins were polyurethane resins, polyvinyl chloride resins, polyacrylates and/or acrylates, elastomeric silicones and combinations of these resins. The preferred phosphorescent sulphide was zinc sulphide, with calcium, cadmium and strontium sulphides also being utilized. U.S. Pat. No. 5,692,895 (1997) to Farzin-Nia et al. discloses luminescent orthodontic appliances. A preferred orthodontic bracket material comprises a plastic material, preferably polycarbonate, glass fiber reinforcement and luminescent pigment, preferably zinc sulfide doped with copper or zinc sulfide doped with copper and manganese. U.S. Pat. No. 5,605,734 (1997) to Yeh discloses a method of making carpet with phosphorescent directional signals and signs. Symbols were tufted into the carpet using polymeric filaments and fibers containing zinc sulfide copper activated pigments.

U.S. Pat. No. 5,698,301 (1997) to Yonetani discloses phosphorescent articles composed of sequential layers of a transparent resin layer containing no UV light absorber, a phosphorescent layer utilizing $SrAl_2O_4$ as the phosphorescent pigment and a reflective layer, with an optional adhesive layer backing on the reflective layer. The transparent resin layer may be materials such as polycarbonates, acrylic resins, polyvinyl chlorides and polyesters. The phosphorescent layer is effected by dispersing the phosphorescent pigment in a varnish prepared by dissolving one of the above resins (preferably an acrylic resin or a vinyl chloride-acrylic copolymer resin) in a solvent and printing onto the transparent or reflective layer. U.S. Pat. No. 5,674,437 (1997) to Geisel discloses methods of making luminescent fibrous material by combining a metal aluminate oxide pigment with a thermoplastic polymer, which is heated, mixed and extruded into fibers. The luminescent comprises a thermoplastic polymer such as polypropylene, polyamides, polyesters, polymethacrylics, polyacrylates, polycarbonates, polycyanoethylenes, polyacrylonitrides, polyvinyl chloride, polyethylene, polystyrene, polyurethane, acrylate resins, halogenated polymers or mixtures. The metal aluminate oxide pigments are selected from strontium, calcium or barium, with or without magnesium, and contain a europium activator and a co-activator of lanthanum, cerium, praseodymium, neodymium, samarium, gadolinium, dysprosium, holmium, erbium, thulium, ytterbium, lutetium tin or bismuth. A plasticizer is also added. U.S. Pat. No. 5,607,621 (1997) to Ishihara et al. discloses methods of making phosphorescent resins and formed articles. The phosphorescent comprises a resinous material such as acrylic resin, ABS resin, acetal homopolymer or copolymer resins, PET, polyamides such as nylon, vinyl chloride resin, polycarbonates, polyphenylene oxide, polyimide, polyethylene, polypropylene or polystyrene, an $SrAl2O_4$ phosphorescent pigment and a liquid paraffin activator. The phosphorescent resin mixture was kneaded at a temperature higher than the melting point of the synthetic resin and extruded to produce pellets for injection or extrusion molding.

U.S. Pat. No. 5,716,723 (1998) to Van Cleef et al. discloses glow in the dark shoe soles of rubber (a styrenic block copolymer or butadiene block copolymers), processing oil (plasticizer or extender), stabilizer (ultraviolet stabilizers, antioxidants and/or preservatives) and phosphorescent material (preferably zinc sulfide copper compounds). Optional ingredients include flow modifiers, modifying polymers and fillers. U.S. Pat. No. 4,629,583 (1986) to Goguen also discloses phosphorescent polymer-containing compositions suitable for use in shoes. The composition includes an elastomeric polymer, a processing oil, a stabilizer and a phosphorescent pigment (preferably a zinc sulfide copper compound), with optional modifying polymers, dry blend flow modifiers and fillers. The elastomeric polymer is preferably a styrenic block copolymer, monoalkenylarene copolymer or polystyrene polybutadiene block copolymer. Preferred modifying polymers included high density polyethylene, ethylene vinylacetate, polybutadiene resins, high styrene resins, poly(alpha-methylstyrene) resin, crystal polystyrene resin, high impact styrene polymers and co-polymers and mixtures thereof.

Numerous other plastic articles containing phosphorescent materials are also known. For example, U.S. Pat. No. 3,936,970 (1976) to Hodges discloses light emitting fish lures. The luminescent material comprises a phosphor such as zinc sulfide, an extender such as magnesium carbonate for increased luminous life, a suspending agent such as silica and zinc palmitate and a carrier for the luminescent material such as a transparent or translucent plastic. U.S. Pat. No. 5,490,344 (1996) to Bussiere discloses glow-in-the-dark fishing lures made by combining a white powder with a plastic resin and a phosphorescent substance. Typical resins include thermoplastic rubber, styrenics, polyolefin and plastisol. U.S. Pat. No. 4,759,453 (1988) to Paetzold discloses a baby bottle marked with a luminescent marker band made of synthetic plastic to which has been added an inorganic zinc sulfide phosphor with double activators. U.S. Pat. No. 4,210,953 (1980) to Stone discloses a flashlight having a luminescent case, band or sleeve containing a zinc sulphide or zinc-cadmium sulphide phosphorescent material.

Polymer epoxies were utilized in U.S. Pat. No. 5,395,673 (1995) to Hunt, which discloses a composition useful for non-slip ground surfaces where lighting conditions may be poor. The composition preferably includes a polymer epoxy (diglycidyl ether resin aliphatic amine adduct modified with amyl ethyl piperidine as a stabilizer), a phosphorescent pigment (preferably copper activated zinc sulfide)and an aggregate such as aluminum oxide.

A much different approach, which points out the need for improved thermosetting luminescent resins, was taken in U.S. Pat. Nos. 5,135,591 (1992) and 5,223,330 (1993) to Vockel, Jr. et al. These patents disclose processes and phosphorescent fiberglass reinforced plastic articles in which a phosphorescent pigment is first applied to the reinforcing fabric using a carrier resin and then cured. Suitable carrier resins include acrylic latex, epoxy, polyvinylchloride, ethylenevinylchloride, polyurethane, polyvinylacetate, acrylonitrile rubber, melamine and co-polymers of these compounds. The phosphorescent coated fabric can then be utilized with both thermoplastic resins (which can be melted and reshaped with heat after curing) and thermosetting resins (which cannot be melted and reshaped with heat after curing) to make FRP (fiberglass reinforced plastic) products. This approach utilizing a phosphorescent fabric was taken for two reasons: 1) previous attempts to add a phosphorescent material directly to a resin system have been unsuccessful, mainly due to the settling away of high density phosphorescent material from the surface of the final article; and 2) the overall relative opacity of the resin mixtures due to shielding by fillers, which prevents the phosphorescent materials from being charged which, in turn, prevents the glow from being visible.

The method of coating the fabric with a phosphorescent utilized by Vockel, Jr. et al. has still left a need for polyester thermoset resin systems in which the phosphorescent pigments do not settle during storage and use and a need for polyester resin systems with suitable transparency and/or translucency characteristics for better utilization of phosphorescent particles. Such thermosetting luminescent resins would be extremely useful as thermosetting resins have properties making them suitable for large items such as boats and spas as well as smaller items. In addition to applications where thermosetting laminating resins are used with fibrous reinforcements, there is a need for improved luminescent thermosetting resins, methods and products in both gel coat applications and casting and molding applications where reinforcing fabrics are not utilized.

Unsaturated polyesters are well known in the art and have been extensively studied and described. Fiberglass reinforced plastic (FRP) is a material in which fibrous materials (including fibers other than glass) are combined with resinous materials, such as thermosetting or thermoplastic polymer resins, to make an article that is stronger than the resin itself. FRP processes are utilized to produce numerous goods such as furniture, swimming pools, baths and spas, boats, automotive products, aerospace products, sporting goods and toys.

Thermosetting resins encompass a wide range of materials including, for example, polyesters, vinyl esters and epoxies. In fabricating a thermoset polyester FRP article, various processes are utilized in which the fiber reinforcements are saturated or wet-out with a liquid thermosetting resin and shaped either manually or mechanically into the form of the finished article. Once formed, the shape is allowed to cure via polymerization of the thermosetting resin. A gel coat may optionally be applied in open mold processes prior to the FRP process. Thermoset molding and casting processes may be utilized to form non-fabric reinforced articles, typically utilizing milled and/or short fiber reinforcement.

Gel coats were introduced when thermosetting polyester resins were first being introduced for use with fiberglass or other fiber reinforcements. It was noticed in molded parts that the surfaces showed a distinct three-dimensional fiber pattern caused by shrinking of the resin away from the glass fibers during curing. Since these early parts were utilized almost exclusively for aircraft, this could not be tolerated for aerodynamic and aesthetic reasons. A remedy was soon developed in the use of gel coats, which today are utilized on the surface of thermosetting polyester plastics to produce a decorative, protective, glossy surface which requires little or no subsequent finishing. Resin and glass fiber reinforcement is applied directly over the gel coat by hand lay-up or spray-up techniques to produce a plastic in which the gel coat coating is an integral part of the composite. The gel coat serves to suppress glass-fiber pattern, eliminating "alligatoring" and crazing of surface resins, eliminating chalking after outdoor weathering, filling pin-holes and rendering the surface resilient, tough and abrasion and impact resistant (without sacrifice of water resistance) so that it can be readily cleaned or buffed to a high gloss. The gel coat surface further acts as a barrier against ultraviolet radiation which would otherwise degrade the glass fiber laminate within the FRP, reduces or eliminates blistering of substrate in high humidity, eliminates the possibility of "weeping" of glass fiber in the presence of water and so on. Gel coats are used extensively for such items as shower stalls and bath tubs, outer surfaces of boats, campers, automotive bodies, swimming pools and a host of other parts and surfaces where a smooth, hard, tough and colored surface is a necessity.

As has been mentioned, one problem with utilizing phosphorescent pigments (which may have a specific gravity of 3.5 to 4 or more) in polymer resins is the tendency of the phosphorescent pigment to settle during blending operations and storage, particularly the larger size particles. Usually known luminescent polymers must be blended and utilized immediately, often with air equipment to keep the phosphorescent particles in suspension. This is also true of thermosetting laminating and casting resins, where typically the phosphorescent particle falls out of suspension and cannot be sprayed or conveniently worked. Thus, there is a particular need for polyester thermoset methods and products which keep the phosphorescent particles in suspension not only during blending and application, but also during storage over the useful life of the luminescent polymer.

An additional problem arises when attempting to utilize a phosphorescent pigment with polyester gel coats. If a phosphorescent particle such as an activated zinc sulfide is added to a gel coat, typically the phosphorescent particles separate out and the mixture overcongeals (similar to adding too much flour to water). An unmet need, therefore, remains apparent for phosphorescent polyester gel coats as well as moldable resins, which has not been provided by the prior art.

Even more useful would be a polyester base resin easily adapted for gel coating applications, laminating applications, casting applications and various molding applications such as injection or blow molding. Typically gel coats are unsuitable as laminating or casting resins, easily crumbling in the hands if molded in thick layers; laminating and casting resins have surface finish problems requiring the use of a gel coat. The usual laminating resins typically cannot be used in casting applications as layers more than 7-10 mm thick will overheat during cure and fracture due to the intrinsic heat buildup. A phosphorescent thermosetting polyester base resin easily adapted to both gel coat applications and the various molding, laminating and casting processes would therefore be particularly useful.

Electroluminescent devices were evidently first proposed by Destrau in 1947. Such a lamp may comprise a sheet of glass or plastic with a conductive layer which acts as a first electrode, an electroluminescent layer comprising phosphor in a binder and a conductive sheet on the other side of the electroluminescent layer which serves as a second electrode. When a voltage is applied across the two electrodes, the phosphor will emit light.

For example, U.S. Pat. No. 4,916,360 (1990) to Mikami et al. discloses a thin film electroluminescent device that comprises an electroluminescent film made with zinc sulfide serving as its host material and doped with a rare earth element to provide luminescent centers, insulating layers sandwiching the film and a pair of electrodes on the outer surface of the insulating layers. The EL film preferably has a ratio of sulfur to zinc atoms (S/Zn) of about $1.02 \leq S/Zn \leq 1.13$, adapted to achieve an increased excitation efficiency at the luminescent centers to exhibit improved luminescent brightness. Rare earth elements having atomic number 59 to 69 (Pr to Tm) are suitable for doping, among which terbium, samarium, europium and praseodymium are desirable and selected in accordance with the desired luminescence color. The film is doped with the rare earth elements in an amount of 0.5 to 3 atom %. U.S. Pat. No. 3,740,616 (1973) to Suzuki et al. discloses electrically luminescent display devices which can be controlled to display characters or patterns. The display devices employ plural-gapped electrodes and multiple layers including an electrically luminescent layer. The electrically luminescent layers disclosed include a composition of zinc sulfide powder activated with copper and aluminum and a plastic binder such as urea resin, zinc sulfide powder activated with copper or manganese in thin film form, cadmium sulfide or silicon carbide luminescent materials and ZnCdS:Ag luminescent material. An insulating layer such as polyester film or barium titanate and a plastic binder which is white in color may be utilized and reflects the luminescence emitted from the electrically luminescent layer, thus intensifying the light output. U.S. Pat. No. 4,665,342 (1987) to Topp et al. discloses polymer luminescent displays formed of a matrix of individual light emitting elements adapted for excitation from a voltage supply. The electroluminescent displays can be manufactured using printed circuit and screen printing techniques. The matrix is formed on a substrate and each of the light-emitting elements comprises a first electrical conductor overlying the substrate, a dielectric with relatively high dielectric constant overlying the first electrical conductor, a light-emitting phosphor embedded in a polymer binder overlying the dielectric, and a second light transmissive electrical conductor such as indium oxide or indium oxide/silver polymer overlying the phosphor and defining a window for enabling viewing of the electrically excited phosphor. A polymer dielectric with a relatively low dielectric constant separates each of the individual light-emitting elements from each other and alleviates cross-talk between the individual light-emitting elements. These examples point out a continuing need for improved phosphorescent polymers for electroluminescent applications.

In summary, there remain various needs and unsolved problems which must be overcome before thermoset polyester resins can be most effectively utilized with the various phosphorescent particles. An effective thermoset resin must be water-resistant, protect UV sensitive phosphorescent pigments and provide a means for keeping heavy phosphorescent particles in suspension during storage and use. Such thermoset resins should have acceptable optical properties for use with phosphorescent pigments. An ideal thermoset phosphorescent polyester resin could be used or easily modified for use as a gel coat, laminating resin, casting resin or moldable resin and would have excellent photoluminescent, thermoluminescent and electroluminescent properties.

BRIEF SUMMARY OF THE INVENTION

In view of the foregoing disadvantages inherent in the known types of luminescent materials, the present invention provides an improved luminescent thermosetting polyester blend.

Photoluminescent, thermoluminescent and electroluminescent phosphorescent resins useful as a base for gel coated, laminated, cast and molded articles are provided. The luminescent resins are thermosetting polyester resins with properties intermediate between those of typical polyester gel coats, laminating resins and casting resins, containing suspending fillers and phosphorescent pigments. The luminescent polymers have improved luminescent properties and improved phosphor-suspending properties for ease of storage and use.

The luminescent polymer resins may be conveniently fabricated by mixing various thermoset polyester gel coat resins, laminating resins and casting resins, sufficient suspending filler or mixture of suspending fillers and a phosphorescent pigment. UV stabilizers are preferably added to protect polymers and any phosphorescent pigments subject to "greying" when such pigments are utilized.

Preferred unsaturated polyester resins in the present invention incorporate maleic and fumaric unsaturated components, orthophthalic and isophthalic aromatic components or substituted derivatives and a glycol or mixtures of glycols (such as neopentyl glycol, propylene glycol, ethylene glycol, diethylene glycol, dipropylene glycol) with styrene monomer. Useful suspending fillers include silica, glass microspheres and various flake, fiber and crystalline fillers. Preferred phosphorescent pigments include multiply activated zinc sulfide phosphors, multiply activated metal aluminate oxide phosphors such as alkaline earth aluminate oxides and mixtures of these phosphors. The luminescent polymer base resin may be made flexible by the addition of orthophthalic and/or isophthalic flexible resins and fire retardant through the use of halogen-substituted derivatives and various additives. The luminescent polymer base resin can be easily modified for use as a gel coat, a laminating resin for FRP products, a casting resin or a moldable resin.

The improved luminescent polymers shows unexpected luminescent and polymer properties. Such luminescent properties include a combination of bright and extremely long glow, rapid recharging of photoluminescent properties after exposure to light and a very strong thermoluminescence which can be activated by heat sources such as body heat, motor heat, brake heat and hot water. Unusual thermoset polymer properties include suitability, ready adaptability and ease of use as a gel coat, a laminating resin, a casting resin and a moldable resin as well as an ability to keep heavy phosphorescent particles in suspension during extended storage and use.

Accordingly, it is an object of the present invention to provide a luminescent polymer with both a bright initial luminescence and a long-lasting luminescence.

It is another object of the present invention to provide a luminescent polyester resin suitable for use as a gel coat.

It is another object of the present invention to provide luminescent polymers providing excellent water-resistance and UV protection to sensitive phosphorescent pigments.

It is another object of the present invention to provide a luminescent thermosetting polyester resin suitable for use in laminating applications.

It is another object of the present invention to provide a luminescent thermosetting polyester resin suitable for use in molding applications.

It is another object of the present invention to provide a luminescent thermosetting polyester resin suitable for use in casting applications.

It is another object of the present invention to provide luminescent polyester gel coats and moldable resins suitable for long term storage and use.

It is another object of the invention to provide photoluminescent polymers which strongly thermoluminesce when exposed to heat.

It is another object of the invention to provide improved mixtures of phosphors, particularly activated zinc sulfide and metal aluminate oxide phosphors, suitable for use in luminescent polymers.

It is another object of the present invention to provide electroluminescent plastics.

A further object of the invention is to provide a method for efficient production of thermosetting phosphorescent resin materials possessing such excellent phosphorescent qualities as light density and light fastness or afterglow combined with excellent polymer resin properties in suspending, protecting and utilizing phosphorescent pigments.

The luminescent gel coats and moldable resins disclosed herein have been found to achieve these objects and advantages. Other objects and advantages of this invention will become apparent from the following description and appended claims.

DETAILED DESCRIPTION OF THE INVENTION

Before explaining the preferred embodiments of the present invention in detail, it is to be understood that the invention is not limited in its application to the particular details disclosed. No limitation with respect to the specific embodiments disclosed is intended or should be inferred. Although the present invention has been described with reference to preferred embodiments, numerous modifications and variations will be apparent to one skilled in the art. These modifications can be made and still the result will come within the scope of the invention. The terminology used herein is for the purpose of description and not of limitation.

In order to better illustrate the luminescent gel coats and moldable resins disclosed here, the following definitions will be utilized.

Although the popular use of the word "phosphorescence" implies any kind of cold light, this term will be restricted here to the lasting luminescence which results from exposure of a substance to visible or ultraviolet radiation—what is more properly designated photoluminescence. An important characteristic of the phosphorescent substances is that no permanent chemical change need result from the exposure to light, thus distinguishing it from chemiluminescence.

The term "thermoluminescence," because of its early discovery and long usage, has been retained for the emission of light on heating a substance to relative low temperatures (far below the point at which incandescence begins). The word implies that heat energy excites the luminescence, and indeed the present invention acts as if heat energy excites luminescence, but theoretical considerations suggest heat merely liberates energy in the form of luminescence, the energy having previously been absorbed from light and stored in the material. The more appropriate term of "thermostimulation" might be applied to conform with the modern explanation of excitation of electrons by the rise in temperature, whose transitions result in the emission of light. Here "thermoluminescence" and "thermostimulation" will be used interchangeably.

"Electroluminescence" is usually applied to the light resulting from flow of current through partially evacuated tubes of gas. However, the phenomenon of electroluminescence also includes, and will be here utilized to describe, the excitation of a luminous sheet of phosphorescent material by an electric current.

The term "unsaturated polyester resin" and "unsaturated polyester gel coat resin" as used herein is intended to encompass thermosetting polyesters made by condensing ethylenically unsaturated dicarboxylic acids or anhydrides or mixtures thereof with a dihydric alcohol or mixtures of dihydric alcohols. The term "polymerizable vinylidene monomer" as used herein is intended to encompass vinyl monomers that are polymerizable with the above-described polyesters.

The need for a useful renewable light source is made apparent by the list of applications for the luminescent polymer blends of the present invention. A partial list of such applications would include: signs (such as warning, exit, advertising, building, directional, accident prevention and street signs); underground or building emergency illumination (including buildings and corridors, airplanes, mineshafts, subways and underground stations, air-raid shelters and hangars); street crosswalk, curb and lane markers; light panels; stairwells and stair tread illumination (especially fire stairs and edges of steps); vehicle markings (including cars, trucks, aircraft, boats, bicycles, trailers, life rafts, hand gliders and helium and hot air balloons); hard hats and safety helmets; safety clothing; barriers and nets for oil spills; outdoor clothing (both urban and wilderness); prisoner's uniforms (a deterrent to night escapes); watch faces, gauges, dials and panels; skis and skateboards; ropes and ramps for water-skiing; parachutes and parasails; marine buoys; camping equipment; fishing equipment (poles, lures and nets); house numbers; safety barricades; agricultural fencing and gate markers; dog, cat and animal collars, harnesses and markers; bush and ski trail markers; telephone and electrical line markers; license plates and emergency vehicle ID and markings; military and defense force applications; fascia and outlines for ignition switches, locks and light switches; smoke detectors including directional markings; musical instruments; night lights; dishes; figurines; insect strips and traps; artificial grass; marine and outdoor carpets; alternatives to reflective markers and tapes; toys; jewelry; mannequins (green and red phosphorescent pigments may be combined to give pinkish skintones); special effects; novelties; etc.

Emergency lighting must operate at all times and in adverse conditions and atmospheres (loss of power, fire, smoke, etc.) and hence creates special difficulties particularly suited to cold light renewable luminescence.

The luminescent polymers disclosed herein are also very useful for coating solar cells, serving to increase output on cloudy days.

Another novel use is coating the reflectors of headlights and other lamps with the luminescent gel coat (which also has good reflective properties). This helps to create a uniform and increased beam of light with no shadows. In combined parking/headlight lamps, it serves to create illumination from the entire reflector when only one light is activated. Taillight lenses may contain luminescent areas which will glow even if the taillight is burned out.

One of the more novel uses for the photoluminescent materials disclosed herein are as an aid to bacterial control in hospitals As a favorite hiding place for bacteria in operating rooms is the darkened areas on the backside of the light reflectors above the operating table (where they tend to fall off onto the patient when disturbed by air currents), coating the backside of the reflector will illuminate the area, making it less hospitable for the light-shy bacteria.

"Black lights" (safe UV lights) are particularly suited for energizing the luminescent polyesters disclosed herein. Black light bulbs coated with the polyesters are particularly useful, as the luminescent gel coats will glow brightly for extended periods after relatively short illumination.

The luminescent gel coat is also particularly suited for precision molding processes in that the thickness of the gel coat can be more easily measured as thin areas are relatively darker.

Luminescent base material for circuit boards and computer chips allows illumination of chips and components for alignment, inspection and diagnostic purposes. "Hot spots" in the chips, parts or connections will cause the luminescent polyester to glow more brightly, particularly useful for design analysis and predicting failure of components.

The luminescent polymers described herein are also particularly useful in certain applications due to the thermoluminescent properties. Thus, for example, clothing and helmets may be activated by body heat, wheels and hubcaps of automotive vehicles may be activated by brake heat, motor covers of marine vehicles and hoods and fenders of automotive vehicles may be activated by engine heat, spas, showers, bathtubs and hottubs may be activated by water heat and other objects may be activated via hot air or liquids.

Novel special effect uses include "liquid writing" on the luminescent polyesters utilizing laser beams or pointers. Interesting effects are further available by coating fiber optic material with the photoluminescent polymers described below. Such photoluminescent polyester coated fiber optics are also useful for signs and directional markers. Heat activated thermostimulation of a photoluminescent article makes the heated areas glow much brighter in chosen designs or writing; hot water works admirably, as will other hot liquids, gases or heating elements.

The luminescent polymer also is also useful for electroluminescent lighting, the luminescent polymer being coated with a metallic and a transparent conductor. Signs may be powered by small batteries in areas where electrical current is not available or economical.

Electroluminescent polymers (luminous capacitors) may be constructed as follows: a conductive substrate (metal, glass with a conductive layer, conductive polymers) is coated with a thin layer of a phosphorescent pigment embedded in a binder with a high dielectric constant (such as the luminous polymers described herein). Typically a much smaller percentage of luminescent phosphor (<1% by weight) is utilized in the electroluminescent embodiments as compared to the photoluminescent embodiments. A smaller percentage of long-life phosphor is desirable in electroluminescent applications so that the light will fade when power is interrupted. Alternatively, short life phosphors may be employed, in larger amounts if desired. Layers can be applied by any of the known methods: spray, curtain coating, screen printing or spread coating, or more exotic methods such as vacuum deposition, ion plating, sputtering and chemical vapor deposition (these and other methods known to those skilled in the art). Plastic or ceramic compounds with high dielectric constants are used as binders. The optimum layer thickness depends on the voltages and the frequencies at which the luminous capacitor is to function.

It is known that unconjugated portions of a polymer show a relatively high quantum efficiency (photons out per excited state, i.e., photons out per photon absorbed for photoluminescence and photons out per electron injected into the structure for electroluminescence) for the radiative decay of singlet excitons. See, for example, U.S. Pat. No. 5,401,827 (1995) to Holmes. However, the efficiencies and efficacy of luminescent materials, particularly polymer containing materials, are not totally explicable by contemporary theoretical models. Therefore there is no presentation herein of a precise explanation as to why the present invention may exhibit higher efficiencies including photoluminescent brightness and length of afterglow and thermoluminescence as compared to known luminescent materials.

In general, a long life phosphor is preferable for photoluminescent and thermoluminescent applications of the present invention as it may become necessary to overload the plastics with additives otherwise. Mixtures can occasionally be useful, particularly that of a phosphor with a very bright initial illumination and a phosphor with an extended afterglow or a mixture of slow and quick charging phosphors. For use in electroluminescent applications, greatly reduced quantities are generally preferred so the luminescence will quickly fade when electrical stimulation ceases.

Various considerations are taken into account when choosing a phosphor or mixture of phosphors for use in various applications. Alkaline earth metal aluminate oxides are preferred outdoor applications and high intensity light applications due to their brighter initial afterglow and longer afterglow. Zinc sulfide phosphors are preferred in conditions of low light illumination for charging. As the alkaline oxide aluminate phosphors are much more expensive than the zinc sulfide phosphors, the zinc sulfide phosphors may be preferable in many applications (such as lower-priced lines and novelties) for economic reasons. Mixtures of zinc sulfide and alkaline earth aluminate phosphors are most useful for objects such as bicycles that may receive both outdoor light and indoor illumination of varying intensities (such as bicycles, clothing, etc.). Mixtures are also most useful for short excitation situations, the zinc sulfide phosphor attaining bright luminescence and saturating charging more quickly than the alkaline earth aluminate oxide phosphors. The sulfide phosphors giving various colors are useful for their particular color and for blending with the yellow-green of copper activated zinc sulfide and alkaline earth aluminates, but length of afterglow tends to be shorter. Short life phosphors of other types known to the art may be preferred for certain electroluminescent applications, particularly in applications where it is important or desired that the light "turn off" rapidly after electrical stimulation ceases.

Although the luminous polyesters disclosed herein can hold 50% or more of phosphorescent pigment, amounts of <1%–20% are generally preferred with 10%–120% being preferred for photoluminescent and thermoluminescent applications and <1%–2% being preferred for electroluminescent applications. Preferred zinc sulfide phosphors may optionally include selenium and silicon. The zinc sulfide phosphors are preferably activated by copper and more preferably additionally activated by a metal element or plurality of metals selected from the group consisting of aluminum, silver, gold, magnesium, manganese, gallium, indium, scandium, iron, calcium and/or lead, by a rare earth or rare earth elements such as cerium, terbium, europium, gadolinium, samarium and/or praseodymium, by halogens, by silicon and/or selenium and by mixtures these elements, particularly by mixtures of metals and rare earths with or without silicon and selenium. Zinc calcium sulfide phosphors and mixtures of zinc sulfide phosphor with calcium sulfide phosphor are also preferred. Preferred metal aluminate oxide phosphors are alkaline earth metal aluminate oxide phosphors such as strontium aluminum oxide, calcium aluminum oxide, barium aluminum oxide or mixtures thereof, preferably activated with europium and co-activated with an element such as lanthanum, cerium, praseodymium, neodymium, samarium, gadolinium, dysprosium, holmium, erbium, thulium, ytterbium, lutetium, the metals tin and/or bismuth or mixtures thereof. The preferred alkaline earth metal aluminate oxides may optionally additionally contain magnesium aluminum oxide. Examples of suitable phosphorescent pigments include multiply activated zinc sulfide such as LUMILUX® ZnS:Cu, available from Hoechst or AlliedSignal of Australia, UMC Phosphorescent pigments (zinc sulfide and mixtures with other sulfides), available from United Mineral & Chemical Corp., USA, rare-earth activated alkaline earth aluminate oxides such as LUMI-LUX® Green-SN long afterglowing pigments available from AlliedSignal of Australia, and LUMINOVA® strontium aluminate oxide pigments available from United Mineral and Chemical Corp., USA, and mixtures of these phosphors.

Suitable sources of excitation for the photoluminescent polymers disclosed herein include daylight, UV light and most forms of artificial light. In general, the wider the spectrum of the energizing light, the longer the afterglow of the photoluminescent plastics. White light rich in UV is very suitable. Red light or yellow light from a sodium vapor lamp is generally less suitable, as are filament bulbs for alkaline earth aluminates in general. Certain luminescent polymers described herein can also be energized or stimulated by electromagnetics and friction (static charges).

The unsaturated polyesters of use in the present invention are the reaction products of polycarboxylic acids or anhydrides and one or more polyhydric alcohols dissolved in a crosslinking monomer containing an inhibitor to prevent crosslinking until the resin is used by the fabricator. The unsaturated polyester is the condensation product of one or more unsaturated dicarboxylic acids or anhydrides, one or more aromatic dicarboxylic acids or anhydrides and one or more polyhydric alcohols in combination with a polymerizable vinylidene monomer. One or more of the components of the polyester must be ethylenically unsaturated, preferably a polycarboxylic acid component.

Typical unsaturated acids include dicarboxylic acids and anhydrides such as maleic anhydride, maleic acid, fumaric acid, methacrylic acid, acrylic acid, itaconic acid and citraconic acid. Maleic anhydride is the most economic derivative, although fumaric acid can be substituted, yielding resins with the same properties but some subtle structural differences. In most commercial formulations, the reactivity of the polyester polymer is derived primarily from the maleic anhydride component. Maleate and fumarate based resins utilizing maleic anhydride, fumaric acid or maleic acid or mixtures thereof are preferred in the present invention. Acrylic acid and methacrylic acid modified polyester resins also find use.

The degree of unsaturation is varied by including a saturated dibasic acid (which includes aromatic acids insofar as polyesters are concerned) such as phthalic anhydride, isophthalic acid, phthalic acid, chlorendic anhydride, tetrabromophthalic anhydride, tetrachlorophthalic anhydride, tetrahydrophthalic acid and anhydride, adipic acid, succinic acid, suberic acid, sebacic acid, azelaic acid, terephthalic acid, etc. Orthophthalic (derived from phthalic anhydride or phthalic acid) and isophthalic (derived from isophthalic acid) based polyester resins and their substituted and halogenated derivatives are particularly preferred in the practice of the present invention. DCPD modified phthalic and/or isophthalic resins may also find use.

Typical polyhydric alcohols include glycols, such as propylene glycol, ethylene glycol, neopentyl glycol, diethylene glycol, dipropylene glycol, 1,4-butanediol, dibromoneopentyl glycol, 2,2,4-trimethyl-1,3-pentanediol, 1,3-butanediol, 1,5-pentanediol, 1,3-propanediol, hexylene glycol, triethylene glycol, tetraethylene glycol, dicyclopentadiene hydroxyl adducts etc.; propylene oxide; triols such as trimethylol ethane, trimethylol propane, trimethylol hexane, and hexane triol; Bisphenol A ethers and Bisphenol A adducts (such as bisphenol dipropoxy ether and the adduct of Bisphenol A with ethylene oxide), hydrogenated Bisphenol A and brominated bisphenols; etc. A glycol or mixtures of glycols are usually preferred in the present invention, particularly those glycol based polyesters that are based on neopentyl glycol or mixtures containing neopentyl glycol (such as neopentyl glycol and one or more of propylene glycol, ethylene glycol, diethylene glycol, dipropylene glycol, dibromoneopentyl glycol, bisphenol dipropoxy ether, 2,2,4-trimethylpentane-1,3-diol, tetrabromobisphenol dipropoxy ether, 1,4-butanediol, Bisphenol A adducts, hydrogenated Bisphenol A and DCPD hydroxyl adducts).

The ethylenically unsaturated polyester is usually a semi-rigid polyester or flexible polyester although mixtures of these can be used with rigid polyesters. The preferred polyesters form copolymerizates with vinylidene monomers. The preferred vinyl monomer is styrene. Styrene when compared with other commercial monomers usually offers equivalent properties at much lower cost. Certain monomers enhance specific properties, for example diallyl phthalate and triallyl cyanurate extend the thermal durability required in certain electrical components. Other monomers include vinyl aromatics such as vinyl toluene, a- methylstyrene, divinylbenzene, p-t-butylstyrene, o-chlorostyrene and dichorostyrene, the alkyl esters of alpha, beta-ethylenically unsaturated monocarboxylic acids such as methyl methacrylate, methylacrylate, ethylacrylate and 2-ethylhexylacrylate, and the vinyl esters such as vinyl acetate and vinyl proprionate. They find some utility, usually in combination with styrene. The vinyl esters are generally less suitable for the practice of the present invention. Preferably, the ethylenically unsaturated polyesters comprise from about 30 to 80 percent of the polymerizable resin-forming components, with the remaining 20 to 70 percent being composed of the crosslinking vinylidene monomers. Control of the amount of styrene is particularly useful in obtaining high gloss surface finishes.

Exposure to heat or light may result in uncontrolled cross-linking and an increase in viscosity; therefore inhibitors (free-radical inhibitors) such as hydroquinone, toluhydroquinone, parabenzoquinone and/or tertiary butyl catechol are typically included in resin formulations to suppress oxygen-initiated free-radical formation and prevent reaction prior to addition of the catalyst.

Weathering resistance is obtained by using neopentyl glycol, methyl methacrylate and UV stabilizers (discussed below). Aromatic derivatives such as isophthalic acid, terephthalic acid or diols derived from Bisphenol A provide a higher degree of hardness, rigidity and enhanced thermal characteristics. Aliphatic constituents such as adipic acid, 1,4-butanediol and diethylene glycol yield soft, pliable products. Property modification is influenced by the number of methylene or oxyethylene units separating the reactive functionality. Monofunctional chain terminators such as benzoic acid or dicyclopentadiene (DCPD) may be employed to develop certain characteristics. Other characteristics are derived from reactive halogenated compounds which impart flame resistance.

Highly branched aliphatic or substituted aromatic derivatives introduce steric effects around the double bond, which reduces its ability to cross-link with styrene or other monomers; 2,2,4-trimethyl-1,3-pentanediol is particularly notable in this respect. α-Methylstyrene is similarly influenced by the pendent methyl grouping on the double-bond carbon, which impedes its reaction rate during the cross-linking with fumarate groups.

Usually, the longer the chain length of the glycol or unsaturated dicarboxylic acid components making up the polyester, the more flexible the polyester. Aromatic components, particularly phthalic acid, are not as effective as long-chain saturated aliphatics in lowering the elastic modulus of the copolymer. Synthetic elastomers also find some use in flexible polyesters.

Gel coats and similar formulations are also variously referred to as gelcoats, flow coats, flowcoats and glazes (glazes typically refer to clear gel coats used to improve the stain resistance, gloss, and depth of coating when applied over cultured marble or cast products). Gel coats utilized in swimming pools are typically nonporous gel coats. Flow coats typically include additional wax and styrene and have superior leveling properties to hide imperfections on the bare fiberglass side of molded products. Tooling gel coats, usually neopentyl glycol based, are designed to meet the exacting requirements of gel coats which are used to manufacture molds. Gel coats (and other polymer resins) are often available in two grades, a summer grade for higher temperatures and a winter grade with promoter materials which will raise the temperature of the curing material after the addition of an appropriate catalyst. Gel coat resins based on neopentyl glycol or a mixture of neopentyl glycol with other glycols are preferred in the practice of the present invention.

The usual gel coat is a polyester resin, often heavily filled with a mineral filler (and pigment if present), that shows very little shrinkage because of its high filler-to-resin ratio. Formulations typically include various additives and catalysts are added just before application. Gel coats typically result in a hard, smooth coating 250–750 μm thick when properly applied and cured. Since the gel coat contains no glass fiber reinforcement, its surface retains a glossy appearance and does not erode to expose glass fibers as in noncoated FRP products.

A typical polyester gel coat formulation might contain the following component materials:

Resin: A low viscosity (500–1000 cps) resin is used so it can be easily filled and will allow entrapped air to escape. Usually a high-impact grade is preferred to insure freedom from chipping caused by impact or thermal stresses. Concentration in the complete formulation is typically 25–95% by weight.

Fillers: The most widely used fillers are calcium carbonate (fine synthetic high purity grades are used for high-viscosity, nonsag coats), hydrated aluminum silicate and other silicates, nepheline syenite, feldspar, carbides, oxides, metal powders and carbon, depending on the particular physical, chemical, or electrical properties desired. The fillers are used primarily to reduce the resin shrinkage, lower the exotherm, increase the hardness, increase the thermal conductivity and dimensional stability, increase the fire retardance, or change the density and opacity of the resin. The filler concentrations may range from 5–75% by weight.

Thixotropic Agents: Colloidal silica or fumed silica and magnesium aluminum silicate clays (such as bentonite) are used as thixotropic modifiers to prevent sagging and running of the gel coat when applied to vertical surfaces and void-free dense surfaces. They are also used to minimize filler settling and increase pigment efficiency. They are used in concentrations of 2–15% by weight. Other known thixotropic agents include hydrogenated castor oil and aliphatic acid amides. As is well known in the art, the thixotropic characteristics of gel coats need to be precisely controlled in view of the thickness of the deposited film and the tendency of such films to sag. The gel coat should be uniformly thixotropic so as to eliminate dripping when applied to vertical surfaces and void-free dense surfaces. Gel coat formulations typically contain accelerators, as extension of gel time can impair the cure of the gel coat in the allotted time, with subsequent application of the resin laminate causing the gel coat to swell and wrinkle. Special attention must be paid to gel-time drift caused by the absorption and deactivation of a cobalt accelerator by pigments and by thixotropic agents such as fumed silica.

Pigments: Pigments are dispersed into the resin to act as coloring agents. They are used in concentrations of 0–10% by weight.

Solvents: Solvents such as acetone are added to the formulation to thin the material to spraying consistency. The minimum amount of solvent (or preferably no solvent) is used since its use can result in attack on the mold release, resulting in sticking parts, poor surfaces, etc.

Other useful components include inhibitors, cure accelerators, leveling agents and defoaming agents.

Gel coats, including those luminescent gel coats of the present invention, are typically formulated to provide minimal draining on vertical surfaces when applied at wet film (surface) thicknesses of approximately 0.50–0.76 mm. As much as 30% shrinkage may occur from wet film to cured film thickness.

Typically catalyzed gel coats are applied to the release-coated mold surface or other surface by spray (the most common method), brush, roller coat or forced slush. The coat is allowed to gel and the reinforcing fiber and laminating resin are applied while the gel coat is still tacky. If done correctly, the bond between the gel coat and the fiber-reinforced laminate will be an excellent one.

Gel coats are normally supplied pre-accelerated to provide gel times of 5–25 minutes depending on temperature and catalyst type and concentration. A sufficient amount of catalyst to cure the composition at ambient temperatures is added (generally 0.5–2.5% by weight) to provide adequate cure.

Gel coats usually must be used in conjunction with a laminating resin, as gel coats utilized alone result in a material which is brittle and crumbles under stress. In this regard the present luminescent polymer is somewhat unique; the blending of gel coat, laminating and casting resins, combined with suspending fillers and metallic phosphors results in a base formulation can be used or easily modified for use as a gel coat resin, laminating resin, casting resin or moldable resin.

Fillers, including reinforcing fillers and suspending fillers, useful in the present invention (in addition to short and long-fiber reinforcements) include silicon dioxide, glass flakes, glass spheres and microspheres, nepheline syenite, feldspar, mica, pumice, calcium carbonate, alumina trihydrate, platy talc, bentonite, magnesium sulfate and other sulfates, titanium oxide, synthetic sodium aluminum silicate (SSAS), calcium silicate, quartz, silicon carbide, alumina and tungsten carbide. Fillers can offer a variety of benefits: increased strength and stiffness, reduction or prevention of fiber bloom (fiber prominence at the surface), reduced cost, reduced shrinkage, reduced exothermic heat, reduced thermal expansion coefficient, improved heat resistance, slightly improved heat conductivity, improved surface appearance, reduced porosity, improved wet strength, reduced crazing, improved fabrication mobility, increased viscosity, improved abrasion resistance and improved impact strength. Fillers can also have disadvantages including limiting method of fabrication and adversely affecting cure and pot life of certain resins. Surface treatment of minerals has advanced to where uniformity and type of silane, stearate, or other wetting/coupling additive can be tailored for optimum performance.

Suspending fillers with appropriate optical properties are a necessary component of the present invention. It is necessary that the any chosen fillers be balanced in such a way that they aid in keeping the phosphor particles in suspension. The heavy phosphorescent particles utilized in the present invention will not stay in suspension in a typical gel coat resin or moldable resin. Sufficient suspending filler to keep the phosphorescent pigment in suspension must be added while taking care that the viscosity characteristics of the luminescent polymer characteristics are those needed for the particular application.

In general, the most useful suspending filler is silica (silicon dioxide) in various forms. A flake or amorphous form of silica suspending filler is preferred in the present invention over a flour or microcrystalline form. Grades from coarse to fine may be utilized, with attention being paid to rheological and thixotropic effects. In finer forms, the sand acts like a sponge and absorbs the resin. The result is a very strong and hard resin which is not brittle and is able to absorb shock, resulting in lower chip levels upon impact. Coarse grains allow heavy loading, excellent dimensional stability and predictable packing. Coarse materials can help control flashing in molding compounds and can be used when a coarse, high-wear finish is desirable. Silica will add weight as well as strength, and thus is useful in items such as fishing lures. Colored sand or larger pebbles may be added to the luminescent thermosetting polyester for uses such as fish ponds or aquariums.

Other preferred suspending fillers include microspheres, milled fiberglass (typically milled with a 1:1 to 20:1 or more aspect or length-to-diameter ratio) and other milled fibers and short fibers, nepheline syenite, feldspar, glass flakes, pumice and mica. Calcium carbonate finds some use as a suspending filler, particularly in crystalline forms such as calcite. Magnesium sulfate, calcium sulfate and other sulfates in crystalline form also find use. ATH (alumina trihydrate, actually a crystalline aluminum hydroxide) also find some use as a suspending filler in addition to use as a flame and smoke retardant. As talc, carbon blacks and other powdery fillers typically are not suspending fillers, great care must be taken in utilizing them in conjunction with the present invention (talc also has a tendency to congeal if overemployed and carbon blacks may interfere with luminescence). Guiding principles and specific applications are discussed further below.

Flakes, including silica, glass and mica, represent a special class of discontinuous reinforcing fillers. Flake reinforcements have an advantage over fibers in that they provide reinforcement in a plane instead of along a single axis. In flake-reinforced composites, properties such as modulus, strength, thermal expansion, and shrinkage are considered planar isotropic.

Crystalline silicas are low oil-absorption products of high Mohs' hardness occurring naturally as sand, quartz, tripoli and novaculite. The low oil absorption results in easy dispersion of the filler and low viscosity of the resin-filler mix. Precipitated and fumed silicas are synthetic premium products, very useful for improvement of suspension characteristics, modification of thixotropic characteristics and reinforcement. Silica has additional benefits as a flow agent and in helping to prevent concussion to the phosphorescent particles.

Nepheline syenite and feldspar may lend particular benefits to gel coats and the present invention by helping to provide weatherable, glossy surfaces and improved stress-cracking resistance. They are hard, easily wet and dispersed, enable transparency and translucency in polymers with good clarity, exhibit chemical, weather and abrasion resistance, and are suitable for food-grade contact applications. The particle surfaces are smooth and glasslike and impart almost no color, and therefore the full masstone effects of color and luminescent pigments are realized. As with all fillers in gel coats, they reduce shrinkage on curing and thus prevent warping or stressing of the laminate and peeling of the gel coat. Because fillers also reduce elongation and impact resistance in rigid thermosets, it is essential that a resilient polyester or more flexible type be used in formulations where feldspar or nepheline syenite are used.

Hollow and solid glass microspheres are widely used in resin systems as their sphericity, controlled particle size and density and other unique properties can improve performance and/or decrease costs. Solid glass spheres range in size from 5 to 5000 $\mu$m. Microspheres, both solid and hollow, have been arbitrarily defined as products with the majority of particles less than 200 $\mu$m in diameter. The size most often used in plastics is less than 44 $\mu$m. They can be glass, ceramic, carbon, organic or polymeric; glass microspheres are generally preferred in the present invention. Both solid and hollow spheres act as tiny bearings, with a minimum ratio of surface are to volume, which reduces viscous drag and provides better flow properties. As microspheres are free of orientation and have no sharp edges, they produce a smoother surface with more uniform shrinkage in the plastic than can be obtained with fibers or many randomly shaped fillers. Solid spheres are typically used where strength is a concern. They modify properties of the resin, especially flexural modulus and compressive strength, improve abrasion and corrosion resistance and reduce mold shrinkage and cycle time. The primary functions of hollow spheres are density reduction, the modification of physical properties including improved stiffness and impact resistance, reduced crazing compared to non-spherical fillers (particularly in flexible applications) and the ability to displace large volumes of higher priced polymer. The surface of both hollow and solid microspheres are available with special coatings to enhance sphere-resin bonding. Solid glass spheres or beads find particular use in applications such as crosswalks, curb markers and numbers, stair treads and other similar applications in amounts up to 30%.

Magnesium sulfate is useful for enhancing the brightness of the luminescent polymers. As with other fillers, a crystalline or flake form is preferred to a powdery form. Calcium sulfate and barium sulfate are similarly useful.

To improve weatherability of the polymer composition and to provide zinc sulfide phosphors with protection from "overloading" or "burning out," a mixture of ultraviolet stabilizers is preferably added. When acted upon by ionizing energy, many phosphorescent compounds gradually decompose with a resultant loss of luminescence. With polymers, UV energy is absorbed by chemical groups known as chromophores, such as a double bond in the polymer structure, residual monomer or catalyst, aromatic or other double-bonded contaminants in any of the ingredients or hydroperoxide or carbonyl groups resulting from thermal oxidation during processing. The photochemical "greying" of zinc sulfide compounds occurs when exposed to UV light in the presence of humidity. This is thought to be due to the deposition of zinc on the crystal surfaces, which eventually results in a decrease in the light output.

"Greying" can be prevented by eliminating one of its causes, viz. atmospheric humidity or UV radiation. Atmospheric humidity and UV radiation may also promote a time-dependent decrease in brightness during the operation of electroluminescent polymers described herein. It is therefore important that sufficient UV stabilizer or stabilizers are present in the photoluminescent and electroluminescent polymers when phosphors containing zinc sulfide are utilized. With phosphors which are not sensitive to UV light, such as alkaline earth metal aluminate oxides, the UV stabilizers need be present only in sufficient quantity to protect the polymer.

With regard to the polyester thermoset polymers useful in this invention, if UV energy absorbed is not rapidly dissipated, it will slowly begin to break the chemical bonds in the polymer's molecular chain; the lower-molecular-weight chain fragments will no longer exhibit the properties of the original polymer. It also generates free radicals, initiating and propagating a chain-degradation reaction. The end results can be embrittlement, discoloration, chalking and loss of physical properties. UV stabilizers interrupt this sequence of events by mechanisms including inhibition of sequence initiation via incorporating additives to screen UV energy (screeners), to preferentially absorb it (absorbers) or to quench the excited state (quenchers) and via incorporating additives that will react chemically with the free radicals and hydroperoxides as soon as they are formed to render them harmless by interrupting the degradation sequence (including free-radical scavengers, antioxidants and peroxide decomposers).

Typical ultraviolet light screeners are pigments which render the polymer translucent or opaque and absorb or reflect UV light. Useful screeners include titanium dioxide and zinc oxide, with organic synergists such as zinc dialkyl dithiocarbamates (methyl and ethyl zimate), nickel-organic salts and phosphites. Care must be taken in utilizing these pigments in the present invention in order to prevent excessive screening of the phosphorescent pigments.

UV absorbers inhibit initiation of the degradation process. Materials in this class compete with the polymer chromophores for UV energy and win because their absorptivity is orders of magnitude greater than that of the chromophores. Once they absorb the UV energy, they convert it into a nondestructive form, infrared energy, which is dissipated harmlessly as heat. UV absorbers include benzophenones such as 2,4-dihydroxy benzophenone, substituted 2-hydroxy-4 -alkoxy benzophenones (such as 2-hydroxy-4-methoxy benzophenone) and hydroxy benzophenones containing sulfonic acid groups and the like (high-alkyl substituents such as ocytl, decyl and dodecyl groups offer reduced volatility and increased compatibility); benzoates such as dibenzoate of diphenylol propane, tertiary butyl benzoate of diphenylol propane, salicylates, resorcinol monobenzoates and aryl or alkyl hydroxy benzoates and the like; triazines such as 3,5-dialkyl-4-hydroxyphenyl derivatives of triazine, sulfur containing derivatives of dialkyl-4-hydroxy phenyl triazine, hydroxy phenyl-1,3,5-triazine and the like; triazoles such as 2-phenyl-4-(2,2'-dihydroxy benzoyl)-triazole, substituted benzotriazoles such as hydroxy-phenyltriazole and substituted hydroxy- benzotriazoles and derivatives of 2(2'-hydroxy phenyl) benzotriazole and the like; oxanilides and substituted oxanilides; acrylic esters; formamidines and any mixtures of the above. Absorbers are more effective in thicker cross sections than in thin ones, and they may not provide the surface with sufficient protection.

UV quenchers (excited-state quenchers) also inhibit initiation, although they function a bit later in the sequence than absorbers. They accept excess energy from polymer chromophores that have absorbed WV energy and are in an excited state, returning the chromophore to the ground state and leaving the quencher in the excited state. The quencher then dissipates its acquired energy harmlessly as heat. Quenchers include organic nickel compounds such as [2,2'thiobis(4-octylphenolato)]-n-butylamine nickel II, nickel salts of thiocarbamate, and complexes of alkylated phenol phosphonate with nickel.

UV scavengers and decomposers operate later in the sequence, inhibiting propagation rather than initiation, through a combination of scavenging and terminating free radicals and decomposing hydroperoxides to harmless non-radical species. This is similar to the function of antioxidants. In fact, secondary antioxidants, organic nickel quenchers and carbon blacks have been cited as decomposers, but, to the extent that they are consumed in a peroxide reaction, primary function suffers. Even with absorbers and quenchers, free radicals are almost always generated; thus the importance of the mechanism of free-radical scavenging and termination, where the stabilizer reacts with radicals formed in initial steps of the degradation sequence. UV scavengers and decomposers include hindered amines (which may function as excited-state quenchers or peroxide decomposers in addition to their main function, free-radical scavenging and termination) such as bis(1,2,2,6,6 pentamethyl-4-piperidinyl sebacate), di[4(2,2, 6,6 tetramethyl piperidinyl)] sebacate and other tetramethyl piperidine compounds and the like. Characteristic of the hindered-amine type is the tetramethyl piperidine structure; a nitroxy radical acts as scavenger for R• and ROO• radicals and is regenerated in the process (the cyclic regeneration being exceedingly useful for UV stabilization). Unlike the absorbers, the hindered amines provide surface protection and are effective in thin sections. Unlike the quenchers, they do not impart color. The hindered amines may be used in combination with absorbers and/or quenchers to maximize UV protection.

To get flame retardance, polyesters are typically halogenated (chlorinated and/or brominated) and/or use high levels of alumina trihydrate (ATH) or other flame retardants. Both of these approaches are useful with the present invention. The flame retardant resins described herein also are particularly useful in that they tend to protect the other polymer resins and the phosphor from UV light.

Flame-retardant polyester resins are obtained by using the reactive intermediates chlorendic anhydride, tetrabromophthalic anhydride, dibromoneopentyl glycol, tetrachlorophthalic anhydride and/or other halogenated acids and glycols. Decabromodiphenyl oxide (DBDPO) (ether), bromobisphenol-A and pentabromodiphenyl oxide blends also find some use. Ionic bromines including phosphonium bromide are utilized for synergistic combinations. The dispersability and compatibility of bromine-containing additives with the polymer matrix are extremely important for achieving a good balance between flame protection and processability. Many halogen-containing flame retardants also include stabilizers to increase shelf life, improve thermal stability and protect processing equipment from corrosion.

ATH is a dry, light powder that functions by absorbing heat, by evolving steam to dilute the combustible gases being generated, and by producing a non-flammable char barrier between the heat and the material. ATH also functions as an extender and as a smoke suppressant. Loading levels are typically relatively high. Various surface treatments can be used to enhance the various properties of ATH-filled polymers, including stearate coating and treatment with silanes, titanates and phosphates to improve properties such as flex strength, flex-whitening, filler handling, wetout, viscosity and mold flow.

Typically ATH materials for sprayup are designed to yield low mix viscosities at high filler loadings as well as good glass wetting and rollout with minimal air entrapment and good suspension characteristics. In a wet-layup system in which the glass is placed in the mold and the filled resin system distributed on it, ATH particle size distribution should be optimized to prevent filtration of the filler and to provide good pigmentation. Pure-white ATH is generally preferable to calcium carbonate as a filler as it imparts a degree of translucency not possible with calcium carbonate due to the different indices of refraction.

Other retardants which may find use include magnesium hydroxide, those based on phosphorus such as phosphate esters, vinylphosphonates such as the bis(hydrocarbyl) vinylphosphonates and their condensation products, antimony oxide, zinc borates, barium metaborates and molybdenum compounds. Magnesium carbonate is an excellent smoke suppressant. Mixtures of compounds are often employed and are often preferred for synergistic flame retardance.

Foaming agents, or blowing agents, and initiators may be useful in molding processes and may be utilized if desired with the present invention. Suitable physical foaming agents include compressed gases and the lower boiling hydrocarbons and halogenated derivatives. Chemical foaming agents useful with the present invention include sulfone hydrazide blowing agents, isocyanate-based agents, nitrogen-based agents and other such agents known to the art. Foaming agents have the additional benefits of helping to keep the phosphorescent particles in suspension and tending to force phosphorescent particles to the surface of the molded article. Since some foaming agents are substantially soluble in the resins utilized in the present invention, the luminescent polymers will contain identifiable proportions of foaming agent if such agents are utilized.

Another useful component of unsaturated polyester resins are flow control agents such as polyacrylic acid, polyalkylacrylates, polyether modified dimethyl polysiloxane copolymer and polyester modified polydimethyl siloxane. Flow control agents are typically used in amounts of about 0.1-5% by weight. Other useful additives may include lubricants, processing aids and primary antioxidants.

Peroxides constitute the principal group of initiators (catalyst) with diacyl peroxides (such as benzoyl peroxide) comprising one class and peroxy esters and ketones (such as methyl ethyl ketone peroxide) the second class (azo compounds may also find use). Organic peroxides are sources of free radicals used as: 1) initiators for free radical polymerization and/or copolymerization of vinyl and diene monomers; 2) curing agents for thermoset resins; and 3) crosslinking agents for elastomers. The choice of catalyst is typically governed by the temperature during processing and curing. The peroxides most useful in the present invention are most commonly used in conjunction with a promoter (cure accelerator) present in the resin. The usual promoters are transition metal salts and acetylacetonates of cobalt, potassium, copper, vanadium, zirconium, manganese and lead such as cobalt naphthenate, cobalt octoate, cobalt 2-ethylhexanoate, divalent and trivalent acetylacetonatocobalt, potassium hexanoate, zirconium naphthenate, vanadium naphthenate, cupric naphthenate, manganese octoate, ferric naphthenate, potassium hexanoate, acetylacetonatozirconium, acetylacetonatovanadium, acetylacetonatolithium and mixtures thereof. Resins may be further promoted with amine accelerators such as dimethylaniline, diethyl anilines and dimethyl-p-toluidine and other substituted anilines. Sulfur compounds suitable as accelerators include dodecyl mercaptan and mercaptoethanol. Other known accelerators include phosphorous-containing compounds and β-diketones.

The temperature at which an organic peroxide catalyst initiator decomposes at a useful rate largely determines the application. Other important factors are cost, solubility, safety, efficiency and type of radicals produced, necessity for refrigerated storing and shipping, compatibility with product systems, effect if any of the finished product, and ability to be activated. For the luminescent polymers disclosed herein, the preferred initiators are usually ketone peroxides, particularly methyl ethyl ketone peroxide (MEKP in 40% solution). The commercially available products are typically made by reacting a ketone with hydrogen peroxide, resulting in a mixture of peroxy structures and hydrogen peroxide.

Reinforced plastics are composites in which a resin is combined with a reinforcing agent to improve one or more properties of the plastic matrix. The reinforcement is a strong inert material bound into the plastic to improve its physical properties (such as strength, stiffness or impact resistance) or to impart specific chemical or thermal properties. The reinforcing agent can be fibrous, powdered spherical, crystalline, or whisker and can be made of organic, inorganic, metallic or ceramic material. The strength-to-weight ratio of reinforced plastics is attributed largely to the nature of the reinforcements, with the matrix material or resin serving to bond the reinforcements together and to transmit the load to the reinforcing fibers or other material.

Micro and short fibers will do a reinforcing job that is not possible with either continuous fibers or fillers for injection molding, extrusion and transfer molding. This class includes whiskers, microfibers, mineral fibers, chopped and milled fibers, short metal fibers and chopped metal-coated fibers. Whiskers are the ultimate-strength short-fiber reinforcement because they are small with a high degree of crystalline perfection. Microfibers are generally polycrystalline fiber bundles and do not possess the purity and crystalline perfection of a true whisker, with a consequent effect on the mechanical properties. Mineral fibers are short fibers found in nature that are processed for use. With the phasing out of asbestos, wollastonite (calcium metasilicate, $CaSiO_3$) is the mineral fiber of primary importance. It has the advantage of a pure-white, wholly acicular (needlelike) form. Chopped and milled fibers are made from continuous fibers such as glass fibers, carbon, boron and aramid fibers, as well as metal fibers. The properties of the chopped and milled fibers are related to structure, size, and manufacturing method. Resilient thermoplastic fibers (ad fabrics) may be specifically engineered to impart needed durability to brittle thermosets and for properties such as non-abrasiveness and shatter-resistance. Metallic fibers, particularly stainless steel fibers, make an excellent conductive reinforcement, but their high price excludes them from most applications with the introduction of much less expensive conductive fibers and fillers, including aluminum coated glass fiber, sliced-aluminum-foil ribbons and melt-spun aluminum fibers. Ceramic fibers offer high temperature resistance, high modulus and compressive strength and outstanding chemical resistance. Resilient thermoplastic fibers have been specifically engineered to impart needed durability to brittle thermosets.

Any fibrous reinforcement must meet specific end-use requirements of strength and cost. For many laminates of low strength requirements, paper is an excellent reinforcement. The preferred fibrous reinforcement in the present invention is usually fiberglass. Several forms of glass fiber products can be used for reinforcing thermosetting plastics. These include woven fabrics, continuous strand roving, chopped strand, woven roving, nonwowen, mats (both continuous strand and chopped strand), yarn, milled fiber, etc. Surfacing mats or veils (open-weave, soft-type cloth glass fiber and synthetic nonwoven fabrics or mats with a thickness of ~0.25 mm.) may be used to support resin-rich surfaces in matched die molding and other processes. In general, for open molding and press molded laminates, woven fabrics are more useful and more common. For molded products, nonwoven mats are more versatile and less expensive. A nonwoven form may be preferred for cost considerations. If unusually high strength at high temperatures is essential regardless of cost, more exotic reinforcements of graphite, carbon fiber, metallic oxide fibers, ceramic, aramid (aromatic polyamides), hybrid aramid/carbon, carbon/glass hybrids, ceramic fibers (defined as nonmetallic inorganic fibrous materials such as refractory ceramic fiber, alumina fibers, boron fibers and silicon carbide monofilament, whisker and fiber forms), alumina boria-silica or alumina chromia-silica (such as Nextel®) or other materials may be required.

Glass fiber reinforcement typically improves the properties of the polymer composite, resulting, for example, in high strength, dimensional stability, resistance to temperature extremes, corrosion resistance, desirable electrical properties and ease of fabrication. Several factors determine the physical properties of reinforced molded parts. Most important is the amount of fiber used—the ratio of glass to resin. Strength increases in direct proportion to the glass content. Fiber length and orientation affect load-bearing capability and continuity of stress transfer. Unidirectional orientation provides optimal strength in one direction and makes it possible to achieve up to 80% glass content. Bi-directional orientation, with a glass content up to 75%, usually places fibers at right angles to each other to provide strength in both directions. Multi-directional or random orientation provides equal but lower strength in all directions, with a glass content upto65%.

Silicate base fiber glass is manufactured from a melt of $SiO_2$ and other oxides that are allowed to cool in fiber form without crystallization (amorphous form). Glass reinforcements having a variety of compositions, filament diameters and forms are useful in this invention.

Various fibrous silicon oxide materials can be used. Examples of types of glass include, but are not limited to, type A glass (an alkali glass which is close to the standard soda lime silica window or bottle glass composition); type E (electrical) glass, probably the type most widely used for reinforced plastics (a boroaluminosilicate glass with good resistance to water, fair resistance to alkali and poor resistance to acid); type C glass (a calcium aluminosilicate); type S and type R glass (high-strength, high-modulus type glass for advanced composites); and type D glass (improved electrical performance and lower density).

The diameter of the glass fiber is preferably less than 20 micrometers (mu m), but may vary from about 3 to about 30 mu m. Glass fiber diameters are usually given a letter designation between A and Z. The most common diameters used in glass reinforced thermoplastics are G-filament (about 9 mu m) and K-filament (about 13 mu m), although fibers up to P-filament (about 18 mu m) may occasionally be utilized. Continuous filament strands are generally cut into lengths of 1/8, 3/16, 1/4, 1/2, 3/4, and 1 inch or longer for compounding efficacy in various processes and products. Commercial glass fiber reinforcement products are usually sized either during the fiber formation process or in a posttreatment, and thus are sold with sizing (organic carrying medium) materials already incorporated. The amount of sizing on the glass fiber product typically ranges from about 0.2 to about 1.5 9 weight percent based on total weight of the glass and the sizing, although loadings up to 10 percent may be added to mat products. Sizing compositions for use in treating glass fibers usually contain a lubricant (generally amine-type lubricants), which provides the protection for the glass fiber strand; a film-former or binder that gives the glass fiber strand integrity and workability; a coupling agent that provides better adhesion between the glass fiber strand and the polymeric materials that are reinforced with the glass fiber strand; and other additives such as emulsifiers, wetting agents, nucleating agents and the like. Various sizing compositions have been developed for glass fiber reinforcements to provide improved adhesion between various polymeric materials and the glass fiber. The lubricant, film-former, and coupling agent can be a single compound or a mixture of two or more compounds.

The film former is usually water soluble or water emulsifiable during processing and must be non-sensitive to water after curing. Examples of film- formers include, but are not limited to, polyesters, epoxy resins, polyurethanes, polyacrylates, polyvinyl acetates, polyvinyl alcohols, styrene-butadiene latexes, starches and the like.

The coupling agent is usually a silane coupling agent that has a hydrolyzable moiety for bonding to the glass and a reactive organic moiety that is compatible with the polymeric material which is to be reinforced with the glass fibers. Complex chrome and titanate crosslinking or coupling agents also may be utilized.

Carbon fibers are used in such areas as automotive, aerospace and sporting-goods applications. They offer high modulus and strength, low density, low thermal coefficient of expansion, low coefficient of friction and excellent resistance to most environmental-exposure conditions and chemicals.

Ceramic fibers are continuous fibers of metal oxides. The major advantages of these fibers are very high temperature resistance plus high modulus and compressive strength. They also have outstanding chemical resistance and can be woven into fabrics.

Several types of conductive fillers and fibers are known to be useful for lowering the innate electrical resistivity of plastics—that is, to impart partial conductivity. This is done at three levels of conductivity—antistatic or electrostatic dissipation (ESD); semiconductive, mostly for power-cable shielding and conductive, to provide shielding against electromagnetic interference (EMI) in electronic packages and cabinetry. Addition of conductive fillers and fibers may prove particularly useful with the present invention in electroluminescent applications where an electrical current is used to excite luminescence.

Another group of materials that has been found to be useful in conjunction to brighten and improve reflective qualities with the present invention are luminescence enhancers such as optical brighteners, fluorescent whiteners, color brighteners and spectrum enhancers. Fluorescent daylight pigments are particularly effective in conjunction with UV stabilizers and benefit from UV protection.

Other materials that may prove useful with the present invention include coral extracts, isolates and derivatives for Lw protection, daylight fluorescent pigments, pearlescent pigments, metallic flake pigments, thermochromics (producing heat-activated color changes), photochromics (producing light-activated color changes), diamond-like materials from solutions of polyphenylcarbyne, color concentrates, etc.

The following descriptions are examples of materials that may be utilized to practice the present invention. They should be considered as examples and not as unduly limiting.

AQUAGUARD 83279 clear gelcoat (FGI product code no. 12217), obtained from fiber glass international (FGI, a division of A. C. Hatrick Chemicals Pty. Ltd.) of Southport, Queensland, Australia, is an orthophthalate, neopentyl glycol and propylene glycol based polyester gelcoat containing alumina trihydrate as a flame retardant. AQUAGUARD gelcoat is a prepromoted thixotropic spray grade developed primarily for use in sanitaryware applications which also finds use in applications such as swimming pools. AQUAGUARD gelcoat is highly durable with excellent flow/leveling properties, rapid air release, good sag and triping/wrinkling resistance with excellent weathering resistance and a high degree of flexibility. AQUAGUARD has a gel time (2% v/w NR20 MEKP) of 10–15 minutes.

JS AQUAGUARD Culture Finish/Clear Gelcoat is a clear polyester/styrene gel coat used as a topcoat for swimming pools containing fumed silica, benzophenone and/or phenolic TV inhibitors and metal naphthenates and octoates as activators. ESCON EX80 (61–286), obtained from FGI of Australia, is a low viscosity, low reactivity, high clarity, acrylic modified polyester resin designed for decorative castings and embedding where excellent color and clarity are desired. ESCON EX80 is supplied pre-accelerated and stabilized to minimize discoloration and deterioration by WV light. On the addition of 1% MEKP at 25° C. a gel time of from 45–60 minutes can be expected. Curing proceeds relatively slowly once the resin has gelled; very low exotherm (approximately 40–50° C.) characteristics give a slow even cure over a period of several hours, ensuring that cracking and discoloration due to overheating is avoided in larger casting. The low viscosity of ESCON EX80 is advantageous in allowing fast release of air bubbles before gelation occurs. Post curing of the finished article is essential. ESCON CR64 (61–283), obtained from FGI of Australia, is a medium viscosity, low reactivity, unsaturated fumaric acid and phthalic (orthophthalate) based resin. ESCON CR64 (61–283) may be substituted interchangeably in the examples herein for the ESCON EX80 (61–286) resin described above. ESCON CR64 is a high clarity polyester designed for the production of decorative castings where excellent color and clarity are essential. It is supplied pre-accelerated for room temperature curing with a gel time of 20–30 minutes at 25° C. with 1% MEKP and contains stabilizers to minimize discoloration by UV light. For very large castings and laminates it may be preferable to use the slower curing casting resin ESCON EX80.

POLYLITE® 33-100-01 (Formerly Koppers 1061-5 West Coast), a Reichhold Chemicals, Inc. unsaturated polyester resin obtained from FGI of Australia, is an orthophthalic, wax-containing laminating resin with 40–50% styrene monomer.

NORPOL 62-303 is a Jotun Polymer AS, Norway (now Reichhold AS Norway) product obtained from FGI of Australia. NORPOL 62-303 orthophthalic polyester resin is a medium reactive general purpose low styrene emission (L.S.E.) resin designed for hand or spray lay-up application, suitable for laminate thickness from 3–7 mm applied wet-on-wet. It is thixotropic and has a built-in accelerator system giving low exothermic temperature combined with relatively long geltime and rapid curing. It has a geltime (2% MEKP) of 30–45 minutes in summer and 20–30 minutes in winter.

DION® ISO 33-434-00 (formerly DION® Iso 6631T), a Reichold Chemicals, Inc. unsaturated polyester resin, is a wax free, high molecular-weight, rigid isophthalic laminating resin with excellent mechanical properties and heat resistance containing a maximum of 55% styrene monomer.

POLYLITE® 61-358 and POLYLITE® 61-359, Reichold Chemicals, Inc. products obtained from FGI of Australia, are high performance isophthalic wax- free polyester resin which are thixotropic, prepromoted, easy to roll out with viscosity suitable for spray-up, low exotherm in thick sections and have a high degree of chemical resistance. POLYLITE® 61-358 is wax free. POLYLITE® 61-359 is a wax containing low styrene emission (L.S.E.) grade. The gel time at 25° C. is approximately 15 minutes with 1% MEKP.

POLYLITE® 61-340 and POLYLITE® 61-341, Reichold Chemicals, Inc. products obtained from FGI of Australia, are rigid, thixotropic prepromoted orthophthalic laminating resins formulated for production of reinforced plastic parts by spray-up or hand lay up techniques. POLYLITE® 61-340 is wax free and POLYLITE® 61-341 contains wax. The gel time is approximately 25 minutes at 25° C. with 1% MEKP. Color change gives visual indication of catalysation, gel and cure, with low color when cured.

ESCON EX663P 61-627, obtained from FGI of Australia, is a general purpose, self-extinguishing orthophthalate (phthalic) based laminating resin containing halogenated compounds, particularly useful when clear laminates are required. The resin contains 30–40% styrene monomer and is thixotropic, prepromoted and formulated for spray and hand applications with a gel time at 25° C. (1%/ MEKP) of 20–30 minutes. The resin when fully cured will conform to the following standards: Rated Class 2—BS 476—Part 7, rated self-extinguishing to ASTMD 635, and having a rating to AS1530—Part 3 1982 of Ignitability Index 16, Spread of Flame Index 9, Heat Evolved Index 10 and Smoke Developed Index 9. Improved fire retardancy can be obtained by the addition of additives such as antimony trioxide or alumina hydrate.

POLYLITE® 61-428, a Reichold Chemicals, Inc. product obtained from FGI of Australia, is an isophthalic flexible casting resin containing 35-37% monomer which gives low color and highly flexible castings. It is used with fillers in reproduction castings and as a blend with other resins where it adds flexibility and reduces the amount of heat generated during the cure.

ESCON 400 (61–440), obtained from A. C. Hatrick Chemicals Pty. Ltd. of Botany, New South Wales, Australia, is a low reactivity, medium viscosity, fully flexible isophthalic resin with a monomer content of 30% and a room temperature gel time of approximately 20-30 minutes. ESCON 400 is used to modify rigid resins to improve impact resistance and minimize stresses and shrinkage and is used in the manufacture of filled patching putties characterized by excellent adhesion and storage stability.

POLYLITE® 61-801 wax solution, a Reichold Chemicals Inc. product obtained from FGI of Australia, is a 5% solution of paraffin wax in styrene monomer. POLYLITE® 61-801 serves to reduce or eliminate surface tack caused by air inhibition during cure and improves surface finish, while the film forming characteristics of the paraffin wax also assist in reducing styrene emission from polyester resins. It is also useful for improving surface smoothness and luster and reducing the need for a mold release agent.

AEROSOL R2O2 fumed silica, obtained from FGI of Australia, is >99.8% $SiO_2$ with a BET surface area of 100±20 $m^2/g$, an average primary particle size of 14 nm and a tapped density of approximately 50g/l.

Q-CEL "5 Series" grade 570 hollow microspheres, a PQ Australia Pty. Ltd. product obtained from FGI, Australia, are organosilicon surface-modified sodium borosilicate high performance microspheres with very good strength. They have a bulk density of 0.34 g/cc, an effective density (liquid displacement) of 0.70 g/cc, and a particle size range of 1–50 microns, with a mean particle size of 20 microns. They are easily dispersed into liquid systems and remain free flowing. The viscosity of the thermosetting polyester base material will increase significantly less per volume imparted when adding Q-CEL in place of other suspending fillers, and as such can be useful in adjusting final viscosity. High shear, high energy mixing is not necessary and can damage or break the sphere.

CAB-O-SIL® M-5 Untreated Fumed Silica, a Cabot Corp. product obtained from FGI of Australia, is a high purity silica which provides rheology control, reinforcement and/or free flow. It has an amorphous form, a surface area of 200±25 $m^2/g$, a bulk density of 40 g/l (2.5 lb./$ft.^3$), a refractive index of 1.46 and an average particle (aggregate) length of 0.2-0.3 microns. HIGILITE H320 (E1000F) Alumina Trihydrate, a Showa Aluminum Industries K.K. product obtained from FGI, Australia, is a fine aluminum hydroxide with excellent whiteness and superior optical character (refractive index of 1.57). HIGILITE is 99.9% $Al(OH)_3$, with a mean particle size of 10 $\mu$m, a bulk density of 0.6 $g/cm^3$ and 1.0 $g/cm^3$ tapped, a whiteness of 98 and a BET specific surface area of 2.0 $m^2/g$.

UCAR® Thermoset Microballoons (Phenolic microballoons), a Union Carbide Chemicals (Australia) Pty. Ltd. product obtained from FGI of Australia, are phenol-formaldehyde resin hollow spheres.

Talc TM, a Commercial Minerals Limited of Australia product obtained from FGI of Australia, is a hydrous magnesium silicate mineral that is predominantly finer than 75 microns (residue >75 microns 1.5% maximum). The talc has a refractive index is 1.59, with a reflectance (457 mu) of 84.

BEKI-SHIELD® conductive fibers, a Bekaert Fibre Technologies product available from Specialised Conductives Pty. Ltd. of Australia, are 8 micron diameter draw stainless steel wires available in both continuous form and chopped fiber form with various polymeric binders.

Calcium carbonate, an APS Ajax Finechem of Australia product, was obtained from FGI of Australia.

Magnesium Sulphate dried (approximately $MgSO_4 \cdot 3H_2O$), an APS Ajax Finechem of Australia product, was obtained from FGI of Australia.

LUMILUX® Green N-PM 50090 long afterglow ZnS:Cu (zinc sulfide:copper) pigment is a Riedel-de Haen GmbH of AlliedSignal Inc. product obtained from Hoechst Australia Ltd. LUMILUX® Green N-PM 50090 has an emission spectrum peak of approximately 530 nm. and a broad excitation spectrum with a peak at approximately 380–400 nm. The afterglow brightness according to DIN 67510 Part 4 (mcd/m2) is 47 after 5 min., 25.4 after 10 min., 8.8 after 30 min., 4.5 after 60 min. and 2.3 after 120 min. The decay to 100 x threshold of perception (=0.3 mcd/m2) occurs after 960 min. LUMILUX® Green N-PM 50090 ZnS:Cu also contains some selenium and silicon is multiply activated by numerous elements in addition to copper, including gallium, indium, magnesium, gold, silver, calcium, manganese and iron. The density is 4.1 g/ml. Frequent excitation of the phosphorescent pigment does not impair the luminous properties.

LUMILUX® Green SN-pigments, available from Riedel-de Haen of Germany, are a long-lasting afterglow luminescent alkaline earth aluminate doped with rare earths. LUMILUX® Green SN-pigments have an excitation maximum of 380 to 400 nm, an emission maximum of 520 nm and a density of approximately 3.5 g/ml. The afterglowing effect is around ten times brighter than that of the classical zinc sulfides such as the LUMILUX® Green N-PM 50090 described above, with a duration of afterglow (down to 0.3 $mcd/m^2$) of up to 3600 minutes. The initial radiant intensity of the afterglow can be increased by up to 30% when excitation is carried out with illumination levels of 3000 to 5000 Lux instead of the usual 1000 Lux. The LUMILUX® Green SN-pigments are stable against greying but are sensitive to water. They are sensitive to spectral excitation beginning in the blue part of the visible spectrum and extending up to well into the longwave UV wavelengths. If the level of illumination available for excitation is low (<300 Lux) or if only a filament bulb is available, the afterglow effect is of a very much reduced level even if "charging" is carried out for a very long time. The maximum afterglow effect is produced with excitation by daylight or high strength, cold-white fluorescent lamps. LUMILUX® Green SN-FO 50069 has a density of 3.4 $g/cm^3$, a screen discharge size of less than 80 $\mu$m (less than 1% oversized particles) and a particle size distribution $d_{50}$ of 40 $\mu$m±4 $\mu$m. The excitation spectrum has a maximum at approximately 370 nm, with a phosphorescence spectra maximum at approximately 520 nm. LUMILUX® Green SN-FOG 50089 has similar properties with a screen discharge size of less than 125 $\mu$m (less than 1% oversized particles) and a particle size distribution $d_{50}$ of 50 $\mu$m±5 $\mu$m.

LUMILUX® Effect N-series pigments, available from Riedel-de Haën, include green, blue, yellow, yellowgreen, orange and red afterglow pigments based on activated zinc sulfides. LUMILUX® Effect Blue N 50050 has a density of approximately 3.2 $g/cm^3$ and an average particle size of 15 $\mu$m. LUMILUX® Effect Red N 100 50031 is a zinc calcium sulfide with a density of approximately 2.5 $g/cm^3$ and an average particle size of 17 $\mu$m.

LUTMINOVA® Green (G) and Blue Green (BG) strontium oxide aluminate long afterglow phosphorescent pigments are manufactured by Nemoto & Co. Ltd. of Japan under U.S. Pat. No. 5,424,006 (discussed above) and are available from United Mineral & Chemical Corp., Lyndhurst, N.J., USA. The initial afterglow brightness and afterglow period is up to ten times that of conventional zinc sulfide based phosphors. They may be activated by a wide wavelength band (200–450 nm) but best results are obtained with an activation under 365 nm, with most effective energy saturation obtained from light sources which are rich in UV light. Afterglow brightness increases with increase in light source intensity; afterglow brightness is also proportional to the intensity of UV contained in the excitation light. LUMINOVA® Green (G) has an emission peak of 520 nm, while LUMINOVA® Blue Green (BG) has an emission peak of 480 nm. Afterglow extinction (time required for afterglow brightness to diminish to 0.32 $mcd/m^2$) is >2,000 minutes.

LUMINOVA® pigments are available in a variety of particle sizes with $D_{50}$ particle sizes varying from 1.45 μm to 42.00 μm. Coarser particles will have better brightness and afterglow. LUMINOVA® Green (G) has a density of 3.6; LUMINOVA® Blue Green (BG) has a density of 3.9.

UMC Phosphorescent pigments, available from United Mineral & Chemical Corp., are sulfide based pigments available in a variety of emission colors and daylight fluorescent colors. UMC 6SSU is a ZnS:Cu phosphor with an emission peak at 529±4, a specific gravity of 4.1 and an average particle size of 22. UMC GSR is a yellow emitting ZnS:Cu,Mn phosphor with emission peaks at 520 and 570, a specific gravity of 4.1 and an average particle size of 22 nm. UMC BAS is a (Ca,Sr)S:Bi blue emitting phosphor with emission peaks at 450 and 580, a specific gravity of 3.2 and an average particle size of 35 nm.

TINUVIN® 292, obtained from Ciba-Geigy Australia Ltd., is a UV stabilizer and spectrum enhancer (color brightener) containing bis (1,2,2,6,6-pentamethyl-4-piperidyl) sebacate and methyl-(1,2,2,6,6,-pentamethyl-4-piperidyl) sebacate. It is recommended for use in concentrations of 0.5–2% based on binder solids.

TINUIN® 171, obtained from Ciba-Geigy Australia Ltd., is a UV stabilizer of 2-(2-hydroxy-benzotriazole-2-yl)-4-methyl-6-dodecyl phenol.

TINTVIN® 384-2 is a Ciba Specialty Chemicals is liquid UV absorber of the hydroxyphenylbenzotriazole class developed for coatings (95% benzenepropanoic acid, 3-(2H-benzotriazol-2-yl)-5-(1,1-dimethylethyl)-4-hydroxy-, C7-9-branched and linear alkyl esters and 5% 1-methoxy-2-propyl acetate). It is suitable for extreme environmental conditions with high performance and durability. Its broad TV absorption allows efficient protection of base coats or substrates. The performance of TINUVIN® 384-2 can be enhanced when used in combination with a HALS stabilizer such as TINUVIN® 292 or 123. These combinations improve the durability by inhibiting or retarding the occurrence of failures such as gloss reduction, cracking, color change, blistering and delamination. TINUVIN® 384-2 is recommended in concentrations of 1.0–3.0% with 0.5–2.0% TINUVIN® 123, 144 or 292.

UVITEX® OB is a Ciba Specialty Chemicals fluorescent whitening agent. It is a high molecular weight low volatility optical brightener of the thiophenediyl benzoxazole class (2,5-thiophenediylbis(5-tert-butyl-1,3-benzoxazole)). UVITEX OB has exceptional whitening properties, good light fastness and a brilliant bluish cast (an absorption peak at ~380 nm and an emission peak at –430 nm. The use levels of UVITEX OB range between 0.005–0.1% depending on performance requirements of the final application. Basically, the brightening effect is not light stable. It may be used in a variety of blends and combinations with other UV stabilizers and optical brighteners; the concentration of UVITEX OB should be increased when combined with the TINUVIN UV stabilizers discussed herein.

GAFSORB TV Absorber 2H4M, A GAF Europe of Surrey, England product obtained from FGI of Australia, is 2-hydroxy-4-methoxy-benzophenone and has a K-value (absorbency index) at 286 nanometers in methanol of 64.0 minimum.

CHIMASSORB 90, a Ciba Specialty Chemicals product obtained from FGI of Australia, is a 2-hydroxy-4-methoxybenzophenone TV stabilizer. BYK-A 501, a product of BYK-Chemie GmbH of Germany obtained from FGI of Australia is a silicone-free air release additive for unsaturated polyesters. BYK-A 501 is a combination of foam destroying polymers used to prevent air entrapment and porosity in filled and unfilled unsaturated polyester, epoxy and vinyl ester resins. BYK-A 501 is preferably added prior to fillers or reinforcements, but can be added into finished compositions without difficulty.

Typical fiberglass products used for producing FRP articles can be utilized. For example, BTI C24, obtained from Brunswick Technologies Inc., is a unidirectional non-woven fabric for reinforced plastics (55% fiber content by weight) with high strength and stiffness, reduced reinforcement print transfer to finished surfaces and good laminate properties. Stitched reinforcing fiberglass was obtained from ACI Fibreglass of Victoria, Australia. The stitching process is used to combine chopped strand mat with roven roving, with nominal weights of 900–1400 g/m² utilized in the standard range. PPG Chopped Strand Mat (CSM), available from PPG Industries, Inc., of Pittsburgh, Pennsylvania, is >93.0% fibrous glass, with a composition consisting principally of silicon oxide in an amorphous vitreous state. The surface sizing is ≦1.0%. The surface binder (polyester) is ≦6.0%. Normally there are no fibers with diameters smaller than 6 microns in PPG chopped strand mat product.

CELOGEN® XP-100, a Uniroyal Chemicals product obtained from A. C. Hatrick Chemicals of Botany, NSW, Australia, is a sulfonylhydrazide chemical blowing agent developed for foaming isophthalic, orthophthalic and other resins for varied thermoset polyester applications. CELOGEN® XP-100 foams at ambient temperature and is easily incorporated into the polyester resin. It is typically added to polyester resins in 2% by weight concentrations prior to addition of the fillers. The foaming action helps to bring phosphorescent particles to the surface of the molded article; in addition, it helps encapsulates glass fibers (if utilized), thereby eliminating the need for the resin to be rolled or otherwise forced into the glass.

In order to better illustrate the present invention, working examples embodying the luminescent gel coats and moldable resins are described below.

EXAMPLE 1

|  | Sample quantity | Parts by weight |
| --- | --- | --- |
| POLYLITE ® 61-358 isophthalic wax free H/P resin | 30 kg | ~10.7% |
| FGI 29-652 A271/77 BW Fire retardant resin* W/G | 30 kg | ~10.7% |
| FGI 32CL 1-N Marbleglaze s/g 369-0002 | 44 kg | ~15.7% |
| POLYLITE ® 61-341 waxed orthophthalic resin | 30 kg | ~10.7% |
| POLYLITE ® 61-340 wax free orthophthalic resin | 30 kg | ~10.7% |
| Talc TM | 25 kg | ~8.9% |
| AEROSOL R202 fumed silica | 26 kg | ~9.3% |
| Q-CEL 570 hollow microspheres | 30 kg | ~10.7% |
| LUMILUX ® Green N-PM 50090 ZnS:Cu | 35 kg | ~12.5% |
| Total: | 280 kg | 100% |

30 kg of FGI 29-652 A271/77 BW Fire retardant resin*W/G was mixed with 30 kg of POLYLITE® 61-340 wax free orthophthalic resin and 25 kg Talc TM blended into the resins. To this mixture was added 30 kg POLYLITE® 61-358 isophthalic wax free H/P resin, 26 kg of AEROSOL R202 fumed silica and 30 kg of Q-CEL 570 hollow microspheres to form a thermosetting polyester/suspending filler base material. In a separate drum, 35 kg of LUMILUX®

Green N-PM 50090 ZnS:Cu was blended into 40 kg of FGI 32CL 1-N Marbleglaze s/g 369-0002 and added to the thermosetting polyester/suspending filler base material and blended. 30 kg of POLYLITE® 61-341 waxed orthophthalic resin and the final 4 kg of 1-N Marbleglaze s/g 369-0002 was then added and blended to form the thermosetting luminescent polyester. Slightly more Q-CEL 570 hollow microspheres to override slight separation of phosphorescent pigment. The result was a product of closed cellular surface with excellent gloss retention suitable for modification for spraying, brushing, rolling and resin transfer molding by the additions of appropriate additives for the respective usage.

Modify this base material for final end use as follows. For a casting gel coat, add wax. For a spray gel coat, add aeration material (BYK) to accelerate flash-off. For a flow coat used for brushing, rolling or interior use, add wax and styrene monomer.

EXAMPLE 2

|  | Sample quantity | Parts by weight |
|---|---|---|
| AQUAGUARD 83279 orthophthalic neopentyl glycol/propylene glycol clear gelcoat | 420 g | 42.0% |
| ESCON EX80 61-286 clear casting resin (or ESCON CR64 61-283 clear orthophthalic/fumaric casting resin) | 230 g | 23.0% |
| POLYLITE ® 61-627 orthophthalic laminating fire retardant resin | 230 g | 23.0% |
| HIGILITE H320 (E1000F) alumina trihydrate | 92.5 g | 9.25% |
| AEROSOL R202 fumed silica | 21 g | 2.1% |
| POLYLITE ® 61-801 wax solution in styrene | 6.5 g | 0.65% |
| Total: | 1000 g | 100% |

A Thermosetting polyester/suspending filler base material was first prepared for use in this and the following examples. POLYLITE® 61-627 fire retardant resin was premixed with the ESCON 61-286 casting resin. With slow speed stirring, the AEROSOL R2O2 fumed silica was mixed in. When all R2O2 fumed silica was added, the mixture was dispersed at high speed to 40–50 microns (Hegman gauge). When dispersion was satisfactory, stirring speed was reduced and the AQUAGUARD 83279 clear gelcoat base and the POLYLITE® 61-801 wax solution added, with stirring being continued until the mix was homogenous. The HIGILITE E1000F alumina trihydrate was then gradually added, increasing stirrer speed as necessary. This resulted in a polyester base with a Brookfield Viscosity LVF 4/60 of 5000–5500 cP, a Brookfield Viscosity LVF 4/6 of 26000–32000 cP and a gel time at 25° C. (1.5% NR2O MEKP) of 20–30 minutes.

Final components can now easily be added to this concentrated thermosetting polyester/suspending filler base material to prepare for addition of the phosphorescent particles, by blending in order in parts by weight as given below (in this and following examples).

|  | Sample quantity | Parts by weight |
|---|---|---|
| Thermosetting polyester/suspending filler base material | 1000 g | 39.2% |
| ESCON EX80 61-286 clear casting resin (or ESCON CR64 orthophthalic/fumaric clear casting resin) | 500 g | 19.6% |
| AQUAGUARD 83279 orthophthalic neopentyl glycol/propylene glycol clear gelcoat | 500 g | 19.6% |
| CAB-O-SIL ® M-5 untreated fumed silica | 20 g | .78% |
| Magnesium sulfate | 20 g | .78% |
| LUMILUX ® Green N-PM 50090 ZnS:Cu | 510 g | 20.0% |
| Total: | 2550 g | 100% |

To this is added 10–15 ml. of wax and styrene (POLYLITE® 61-801 wax solution) that enhances the retentive sheen or surface gloss of the luminescent polyester. This luminescent polyester resin may be utilized for gel coating and molding or may be made flexible as in the examples below. The example given can easily be scaled up to drum size or larger.

TV stabilizers, spectrum enhancers, fluorescent whitening agents and/or optical brighteners are added before or after the LUMILUX®. If the mixture appears slightly "floury," they are preferably added before the phosphorescent pigment. If the mixture is "watery," they should be added afterwards. Otherwise, they are added in split portions before and after the phosphors. UV stabilizers and luminescence enhancers may be utilized in percentages ranging fro 0.1–3.0 percent, with the lower ranges of UV stabilizer being preferred when alkaline earth aluminate oxide phosphors are utilized and the upper ranges being utilized with zinc sulfide phosphor (and mixes of phosphors containing ZnS) and luminescence enhancers.

EXAMPLE 3

|  | Sample quantity | Parts by weight |
|---|---|---|
| Luminescent polyester resin | 7.50 kg | 75% |
| POLYLITE ® 61-428 isophthalic flexible casting resin | 1.25 kg | 12.5% |
| ESCON 400 (61-440) fully flexible isophthalic resin | 1.25 kg | 12.5% |
| Total: | 10 kg | 100% |

A semi flexible luminescent polyester was prepared by mixing 7.5 kg of the luminescent polyester resin from Example 2, 1.25 kg of POLYLITE® 61-428 isophthalic flexible casting resin flexible casting resin and 1.25 kg ESCON 400 (61–440) fully flexible isophthalic resin. The semi-flexible version is useful for items such as toys, signs, numbers, lettering, lures, fishing floats and the like.

EXAMPLE 4

|  | Sample quantity | Parts by weight |
|---|---|---|
| Luminescent polyester resin | 6.0 kg | 60% |
| POLYLITE ® 61-428 isophthalic flexible casting resin | 1.0 kg | 10% |
| ESCON 400 (61-440) fully flexible isopthalic resin | 3.0 kg | 30% |
| Total: | 10 kg | 100% |

A fully flexible luminescent polyester was prepared by mixing 6.0 kg of the luminescent polyester resin from Example 2, 1.0 kg of POLYLITE® 61-428 isophthalic flexible casting resin flexible casting resin and 3.0 kg of ESCON 400 (61–440) fully flexible isophthalic resin. The fully flexible version is useful for items such as clothing, curtains, fishing rods, fishing nets, yacht sails and flags, curved structures and advertising materials and the like.

EXAMPLE 5

A thermosetting polyester/suspending filler base material was prepared as in Example 2. To the base material were added the components as listed below to produce a luminescent polyester resin containing 10% phosphorescent pigment (composed of 70% zinc sulfide phosphor and 30% alkaline earth aluminate phosphor).

|  | Sample quantity | Parts by weight |
|---|---|---|
| Thermosetting polyester/suspending filler base material | 130 g | 26% |
| NORPOL 62-303 orthophthalic waxed resin | 90 g | 18% |
| ESCON EX8O 61-286 clear casting resin (or ESCON CR64 orthophthalic/fumaric clear casting resin) | 110 g | 22% |
| JS AQUAGUARD culture finish/clear gelcoat | 110 g | 22% |
| Magnesium sulfate | 2.5 g | .5% |
| Calcium carbonate | 2.5 g | .5% |
| CAB-O-SIL ® M-5 untreated fumed silica | 5 g | 1% |
| LUMILUX ® Green N-PM 50090 ZnS:Cu | 35 g | 7% |
| LUMILUX ® Green N-PM 50090 alkaline earth aluminate | 15 g | 3% |
| Total: | 500 g. | 100% |

EXAMPLE 6

A thermosetting polyester/suspending filler base material was prepared as in Example 2. To the base material were added the components as listed below to produce a luminescent polyester resin containing 15% phosphorescent pigment (80% zinc sulfide phosphor and 20% alkaline earth aluminate phosphor).

|  | Sample quantity | Parts by weight |
|---|---|---|
| Thermosetting polyester/suspending filler base material | 123.5 g | 24.7% |
| NORPOL 62-303 orthophthalic waxed resin | 85 g | 17% |
| ESCON EX80 61-286 clear casting resin (or ESCON CR64 orthophthalic/fumaric clear casting resin) | 103.5 g | 20.7% |
| JS AQUAGUARD culture finish/clear gelcoat | 103.5 g | 20.7% |
| Magnesium sulfate | 2.375 g | 0.475% |
| Calcium carbonate | 2.375 g | 0.475% |
| CAB-O-SIL ® M-5 untreated fumed silica | 4.75 g | 0.95% |
| LUMILUX ® Green N-PM 50090 ZnS:Cu | 60 g | 12% |
| LUMILUX ® Green N-PM 50090 alkaline earth aluminate | 15 g | 3% |
| Total: | 500 g. | 100% |

EXAMPLE 7

A thermosetting polyester/suspending filler base material was prepared as in Example 2. To the base material were added the components as listed below to produce a luminescent polyester resin containing 20% phosphorescent pigment (90% zinc sulfide phosphor and 10% alkaline earth aluminate phosphor).

|  | Sample quantity | Parts by weight |
|---|---|---|
| Thermosetting polyester/suspending filler base material | 140 g | 28% |
| NORPOL 62-303 orthophthalic waxed resin | 50 g | 10% |
| ESCON EX80 61-286 clear casting resin (or ESCON CR64 orthophthalic/fumaric clear casting resin) | 100 g | 20% |
| JS AQUAGUARD culture finish/clear gelcoat | 100 g | 20% |
| Magnesium sulfate | 2.5 g | 0.5% |
| Calcium carbonate | 2.5 g | 0.5% |
| CAB-O-SIL ® M-5 untreated fumed silica | 5 g | 1% |
| LUMILUX ® Green N-PM 50090 ZnS:Cu | 90 g | 18% |
| LUMILUX ® Green N-PM 50090 alkaline earth aluminate | 10 g | 2% |
| Total: | 500 g. |  |

EXAMPLE 8

A thermosetting polyester/suspending filler base material was prepared as in Example 2. To the base material were added the components as listed below to produce a luminescent polyester resin containing 20% phosphorescent pigment (80% zinc sulfide phosphor and 20% alkaline earth aluminate phosphor).

|  | Sample quantity | Parts by weight |
|---|---|---|
| Thermosetting polyester/suspending filler base material | 140 g | 28% |
| NORPOL 62-303 orthophthalic waxed resin | 50 g | 10% |

-continued

|  | Sample quantity | Parts by weight |
|---|---|---|
| ESCON EX80 61-286 clear casting resin (or ESCON CR64 orthophthalic/fumaric clear casting resin) | 100 g | 20% |
| JS AQUAGUARD culture finish/clear gelcoat | 100 g | 20% |
| Magnesium sulfate | 2.5 g | 0.5% |
| Calcium carbonate | 2.5 g | 0.5% |
| CAB-O-SIL ® M-5 untreated fumed silica | 5 g | 1% |
| LUMILUX ® Green N-PM 50090 ZnS:Cu | 80 g | 16% |
| LUMILUX ® Green N-PM 50090 alkaline earth aluminate | 20 g | 4% |
| Total: | 500 g. | |

EXAMPLE 9

A thermosetting polyester/suspending filler base material was prepared as in Example 2. To the base material were added the components as listed below to produce a luminescent polyester resin containing 10% phosphorescent pigment (60% zinc sulfide phosphor and 40% alkaline earth aluminate phosphor).

|  | Sample quantity | Parts by weight |
|---|---|---|
| Thermosetting polyester/suspending filler base material | 130 g | 26% |
| NORPOL 62-303 orthophthalic waxed resin | 90 g | 18% |
| ESCON EX80 61-286 clear casting resin (or ESCON CR64 orthophthalic/fumaric clear casting resin) | 110 g | 22% |
| JS AQUAGUARD culture finish/clear gelcoat | 110 g | 22% |
| Magnesium sulfate | 2.5 g | 0.5% |
| Calcium carbonate | 2.5 g | 0.5% |
| CAB-O-SIL ® M-5 untreated fumed silica | 5 g | 1% |
| LUMILUX ® Green N-PM 50090 ZnS:Cu | 30 g | 6% |
| LUMILUX ® Green N-PM 50090 alkaline earth aluminate | 20 g | 4% |
| Total: | 500 g. | 100% |

EXAMPLE 10

A thermosetting polyester/suspending filler base material was prepared as in Example. To the base material were added the components as listed below to produce a luminescent polyester resin containing 10% alkaline earth aluminate phosphorescent pigment.

|  | Sample quantity | Parts by weight |
|---|---|---|
| Thermosetting polyester/suspending filler base material | 130 g | 26% |
| NORPOL 62-303 orthophthalic waxed resin | 90 g | 18% |
| ESCON EX80 61-286 clear casting resin (or ESCON CR64 orthophthalic/fumaric clear casting resin) | 110 g | 22% |
| JS AQUAGUARD culture finish/clear gelcoat | 110 g | 22% |
| Magnesium sulfate | 2.5 g | 0.5% |
| Calcium carbonate | 2.5 g | 0.5% |
| CAB-O-SIL ® M-5 untreated fumed silica | 5 g | 1% |
| LUMILUX ® Green N-PM 50090 alkaline earth aluminate | 50 g | 10% |
| Total: | 500 g. | 100% |

EXAMPLE 11

A thermosetting polyester/suspending filler base material was prepared as in Example 2. To the base material were added the components as listed below to produce a high viscosity luminescent polyester resin containing 5.5% alkaline earth aluminate phosphorescent pigment suitable for pressurized resin transfer molding (RTM).

|  | Sample quantity | Parts by weight |
|---|---|---|
| Thermosetting polyester/suspending filler base material | 229.5 g | 45.9% |
| Talc TM | 168.45 g | 33.69% |
| UCAR ® thermoset microballoons | 7.3 g | 1.46% |
| BYK-A 501 air release additive (or calcium carbonate) | 67.25 g | 13.45% |
| LUMILUX ® Green N-PM 50090 ZnS:Cu | 27.5 g | 5.5% |
| Total: | 500 g. | 100% |

In all the above examples, 1.0% minimum to 2.0% maximum 40% methyl ethyl ketone peroxide catalyst is preferred and was used to provide adequate cure. It is recommended that the above luminescent gel coats be used within the temperature range of 15–30 degrees Celsius. In working at temperatures other than room temperature, adjustment must be made for the change in gel time with the polyesters. Air temperature measurement alone is not sufficient to determine the catalyst concentration to use, as the temperature of the gel coat and the mold or application surface must also be taken into account; cold molds or surfaces possibly resulting in undercuring of the gelcoat. The following temperature range/catalyst percentage is recommended for the luminescent gel coats described herein when utilizing 40% MEKP as catalyst:

| Temperature Range | Catalyst Percentage |
|---|---|
| Below 15° C. | Not Recommended |
| 15°–20° C. | 2.0% |
| 21°–25° C. | 1.5% |
| 26°–30° C. | 1.0% |
| Above 30° C. | Not Recommended |

The above catalyst concentrations provide gel times of approximately 10–15 minutes in a 100 gm. sample of the luminescent gel coat or approximately 20–30 minutes on the mold. Problems with cure may occur with less than 1% or more than 2% catalyst. With the present invention, the practice of diluting the catalyst with additional plasticizers (such as dimethyphthalate) will cause undercure, as will the practice of thinning catalyst with solvents such as ethyl acetate. Various catalysts are well known to the art which may be utilized outside the preferable temperature range with MEKP in applications where molding is done at other temperature.

The clear casting resins are a helpful additive both as a flow agent and as a suspension additive. The isophthalic and orthophthalic polyester resins are also useful suspension additives to a base gel coat.

It is important that suspending fillers and any other fillers be added to the polymers to modify the viscosity prior to addition of the phosphorescent pigments. The shrouding effect of the viscous material helps prevent damage to the phosphorescent particles.

When mixing the LUMILUX® or other phosphorescent material into the resin base, observation of the "skin" of the resin is extremely useful in adding the ideal amount. When the ideal amount is added, the gaps in the polymer will be filled in and an iridescence or sheen will be visible on the surface (and on the surface of a spatula dipped into the mixture) and the skin looks compacted and dense. Addition of too much phosphor causes the mixture to thicken, with the surface becoming floury and losing its sheen, resulting in an overly dry and brittle material with impaired structural and luminescent properties.

When mixing, an air mixer is generally preferred as it cuts down on the concussion impact and bruising which adversely affects the properties. A preferred mixer is the jet type mixer 15244 or 15245 obtainable from United States Plastic Corp. of Lima, Ohio. As the light output of zinc sulfide luminescent pigments is closely associated with their crystalline structure, care should be taken at all stages of processing not to destroy the crystals by mechanical force. In general, a smaller phosphorescent particle is useful for more "compactness" at the surface.

The luminescent gel coat may be used for dressing naked fibers and laminating resin on both interior and exterior surfaces. For a particularly smooth and decorative surface, additional wax and styrene monomer may be added.

The luminescent gel coat formulations presented above are applied to the surface of a mold with a suitable method such as spraying or rolling. After partial curing, the gel-coated film is lined with fiberglass, the desired laminating resins (which may or may not be luminescent) are applied, and the assembly is cured and demolded to form a shaped article with the luminescent gel coat as the surface layer. Similarly, luminescent gel coat may be applied last to form the finished interior layer of the article (e.g., the interior of a boat). A suitable non-luminescent laminating resin for inner, hidden layers is POLYLITE® 61–358.

Release agents may be applied to the mold surface before fabrication to facilitate the release of the cured laminated product. The release agent should be insoluble and impervious to styrene to function well. Polyvinyl alcohol (PVA) solutions form a release film that allows excellent replications of the mold surface; for less complex moldings, natural polishing waxes, including those with a high carnauba content, are suitable.

A foaming agent tends to force the phosphorescent particles to the surface of the finished molded articles, resulting in excellent luminescent properties. Similarly, injection molding tends to force the phosphor particles to the surface when the luminescent polymers described herein are utilized. For use in injection molding, typically a thicker viscosity is preferred than for use as a gel coat.

Conductive fibers such as BEKI-SHIELD® stainless steel conductive fibers may be incorporated into the thermosetting polyester blends and are useful in electroluminescent applications (via increased electrical conductivity) and thermoluminescent applications (via increased thermal conductivity) utilizing metal aluminate oxide phosphors, which are slower to respond to thermostimulation than the zinc sulfide phosphors.

Excess trim from moldings is suitable for recycling and reuse in the luminescent polymers disclosed herein.

It will be readily apparent to those skilled in the art as to how the above examples designed for spray processing, open mold processing and injection and blow molding may be modified for utilization in the other processes such as such as pressed laminates, resin transfer molding (RTM) and structural reaction injection molding (SRIM), compression or matched die molding, filament winding, spin or rotational molding, continuous panel process, premix or bulk molding compound, preforms and prepregs, vacuum-bag molding, pressure bag molding, autoclave molding, thermoset pultrusion, pulforming and extrusion. It will also be apparent to those skilled in the art as to the factors necessary to determine optimum mixtures and conditions in accordance with the invention disclosed above as variations are made in the coating or mold processing technology.

Examples of the invention described above have been made and tested and found to deliver the advantages described. The luminescent polymers have been utilized as a gel coat on items including automobiles, hubcaps, bicycles (frame and wheel rims), signs, boats (exterior trim), trailers, outboard motor covers, fishing poles and banners. The luminescent polymers have been further utilized to mold items including safety and bicycle helmets, a dinghy runabout boat, house numbers and letters, keys for musical keyboards, skateboards, scratchplates for guitars, light switch and door handle surrounds, doors, smoke detector covers, knife and tool handles, telephones, floor tiles, ceiling and wall panels, stair treads, seat inserts and table tops, printed circuit boards, headlight and light reflectors, solar cell lens, spa baths and vanity basins, watch and clock faces, cats eye road markers, mouse and rat traps, flying insect catchers, walking sticks, lamp stands, remote controlled car bodies, battery covers for trucks, fishing lures, fiberglass rocks for use in spas and novelty items. Flexible items made and tested have included fishing nets, clothing and ship's pennants.

It should be understood the foregoing detailed description is for purposes of illustration rather than limitation of the scope of protection accorded this invention, and therefore the description should be considered illustrative, not exhaustive. While the invention has been described in connection with preferred embodiments, it will be understood that there is no intention to limit the invention to those embodiments. On the contrary, it will be appreciated that those skilled in the art, upon attaining an understanding of the invention, may readily conceive of alterations to, modifications of, and equivalents to the preferred embodiments without departing from the principles of the invention, and it is intended to cover all these alternatives, modifications and equivalents. The scope of the patent protection is to be measured as broadly as the invention permits. Accordingly, the scope of the present invention should be assessed as that of the appended claims and any equivalents falling within the true spirit and scope of the invention.

I claim:

1. A luminescent polymer comprising:
    a) a thermosetting polyester;
    b) a suspending filler;
    c) a phosphorescent pigment;

d) a polymerization catalyst; and e) a reinforcing material comprising a reinforcing fabric, wherein the reinforcing fabric is a fiberglass fabric.

2. A photoluminescent and thermoluminescent gel coated article prepared by adding a polymerization catalyst to a photoluminescent and thermoluminescent polymer and applying as a gel coat to a surface of an article wherein the photoluminescent and luminescent polymer comprises a) a thermosetting polyester resin;

b) a suspending filler; and c) photoluminescent and thermoluminescent phosphorescent particles.

3. Coated articles formed by adding a polymerization catalyst to a photoluminescent and thermoluminescent polymer comprising a thermosetting polyester resin, a suspending filler and photoluminescent and thermoluminescent phosphorescent particles wherein catalyzed photoluminescent and thermoluminescent polymer is utilized as a gel coat to form coated articles selected from the group consisting of laminated articles, cast articles and molded articles.

4. A photoluminescent and thermoluminescent article prepared by adding a polymerization catalyst to a photoluminescent and thermoluminescent polymer and applying to a preexisting article to form the photoluminescent and thermoluminescent article, wherein the photoluminescent and thermoluminescent polymer comprises a thermosetting polyester resin, a suspending filler and photoluminescent and thermoluminescent phosphorescent particles and the preexisting article is a fiber optic material.

5. A photoluminescent and thermoluminescent article prepared by adding a polymerization catalyst to a photoluminescent and thermoluminescent polymer and applying to a preexisting article to form the photoluminescent and thermoluminescent article, wherein the photoluminescent and thermoluminescent polymer comprises a thermosetting polyester resin, a suspending filler and photoluminescent and thermoluminescent phosphorescent particles and the preexisting article is a UV bulb.

6. A photoluminescent and thermoluminescent article prepared by adding a polymerization catalyst to a photoluminescent and thermoluminescent polymer and applying to a preexisting article to form the photoluminescent and thermoluminescent article, wherein the photoluminescent and thermoluminescent polymer comprises a thermosetting polyester resin, a suspending filler and photoluminescent and thermoluminescent phosphorescent particles, and wherein the photoluminescent and thermoluminescent polymer additionally comprises a flexible polyester component and is applied to fabrics to form photoluminescent and thermoluminescent fabrics and articles of clothing.

7. A photoluminescent and thermoluminescent article prepared by adding a polymerization catalyst to a photoluminescent and thermoluminescent polymer and applying to a preexisting article to form the photoluminescent and thermoluminescent article, wherein the photoluminescent and thermoluminescent polymer comprises a thermosetting polyester resin, a suspending filler and photoluminescent and thermoluminescent phosphorescent particles and wherein the photoluminescent and thermoluminescent polymer further comprises a fire retardant material selected from the group consisting of fire retardant resins and fire retardant additives.

8. The photoluminescent and thermoluminescent article of claim 7 wherein the fire retardant resins comprise reactive intermediates selected from the group consisting of chlorendic anhydride, tetrabromophthalic anhydride, dibromoneopentyl glycol, tetrachlorophthalic anhydride, decabromodiphenyl oxide (DBDPO) (ether), bromobisphenol-A and pentabromodiphenyl oxide.

9. The photoluminescent and thermoluminescent article of claim 7 wherein the fire retardant additives are selected from the group consisting of ionic bromines, phosphonium bromide, alumina trihydrate, magnesium hydroxide, phosphate esters, vinylphosphonates, bis(hydrocarbyl) vinylphosphonates and their condensation products, antimony oxide, zinc borates, barium metaborates, molybdenum compounds, magnesium carbonate and mixtures of these additives.

10. The photoluminescent and thermoluminescent article of claim 7 wherein the photoluminescent and thermoluminescent polymer is applied to a fabric and utilized to form fire retardant articles selected from the group consisting of clothing and hot air balloons.

11. A process of preparing a luminescent polymer comprising the steps of mixing:

a) a thermosetting polyester resin;

b) a vinylidene monomer;

c) a suspending filler;

d) a thixotropic modifier;

e) a Uv stabilizer; and f) a phosphorescent pigment;

wherein the thermosetting polyester resin comprises:

i) an ethylenically unsaturated dicarboxylic acid or anhydride component selected from the group consisting of maleic anhydride, maleic acid, fumaric acid, methacrylic acid, acrylic acid, itaconic acid and citraconic acid;

ii) an aromatic dicarboxylic acid or anhydride component selected from the group consisting of phthalic anhydride, isophthalic acid, phthalic acid, chlorendic anhydride, tetrabromophthalic anhydride, tetrachlorophthalic anhydride, tetrahydrophthalic acid and anhydride, adipic acid, succinic acid, suberic acid, sebacic acid, azelaic acid, terephthalic acid and mixtures thereof; and iii) a dihydric alcohol selected from the group consisting of neopentyl glycol, propylene glycol, ethylene glycol, diethylene glycol, dipropylene glycol, dibromoneopentyl glycol, bisphenol dipropoxy ether, 2,2,4-trimethylpentane-1,3-diol, tetrabromobisphenol dipropoxy ether, 1,4-butanediol, Bisphenol A adducts, hydrogenated Bisphenol A, DCPD hydroxyl adducts and mixtures thereof.

12. A process of preparing a luminescent polymer comprising the steps of mixing:

a) a thermosetting polyester resin;

b) a vinylidene monomer;

c) a suspending filler;

d) a thixotropic modifier;

e) a UV stabilizer; and f) a phosphorescent pigment;

wherein the thermosetting polyester resin comprises:

i) an unsaturated component selected from the group consisting of maleic anhydride, fumaric acid, maleic acid and mixtures thereof;

ii) an aromatic component selected from the group consisting of phthalic anhydride, isophthalic acid and phthalic acid; and iii) a glycol selected from the group consisting of neopentyl glycol, propylene glycol, ethylene glycol, diethylene glycol, dipropylene glycol, dibromoneopentyl glycol, bisphenol dipropoxy ether, 2,2,4-trimethylpentane-1,3-diol, tetrabromobisphenol dipropoxy ether, 1,4-butanediol, Bisphenol A adducts, hydrogenated Bisphenol A, DCPD hydroxyl adducts and mixtures thereof.

13. The process of preparing a luminescent polymer coated surface comprising the steps of:
   a) preparing a luminescent polymer resin by mixing a thermosetting polyester resin, a vinylidene monomer, a suspending filler, a thixotropic modifier, a UV stabilizer and a phosphorescent pigment;
   b) adding a polymerization catalyst to form a catalyzed luminescent polymer resin; and
   c) applying the catalyzed luminescent polymer resin to a surface.

14. A luminescent article comprising an article having at least a portion of a surface to which a luminescent polymer has been applied, wherein the luminescent polymer is prepared by a process comprising the steps of mixing a thermosetting polyester resin, a vinylidene monomer, a suspending filler, a thixotropic modifier, a UV stabilizer and a phosphorescent pigment and adding a polymerization catalyst.

15. The process of making a luminescent polymer comprising:
   a) mixing a thermosetting polyester gel coat resin with a thermosetting moldable resin selected from the group consisting of thermosetting laminating resins, thermosetting casting resins and mixtures thereof to form a thermosetting polyester resin mixture;
   b) adding a suspending filler to the thermosetting polyester resin mixture in amounts sufficient to suspend heavy phosphorescent pigments; and
   c) adding a phosphorescent pigment to the thermosetting polyester resin mixture.

16. The process of making a luminescent polymer of claim 15 wherein the thermosetting polyester resin mixture is selected from the group consisting of orthophthalic polyester resins, isophthalic polyester resins, maleate polyester resins, fumarate polyester resins, glycol polyester resins and mixtures thereof.

17. The process of making the luminescent polymer of claim 15 wherein the process further comprises mixing a thermosetting fire retardant polyester resin into the resin mixture.

18. The process of making the luminescent polymer of claim 15 wherein the process further comprises mixing a thermosetting flexible polyester resin into the resin mixture.

19. The process of making a luminescent shaped article comprising:
   a) mixing a thermosetting polyester gel coat resin with a thermosetting moldable resin selected from the group consisting of thermosetting laminating resins, thermosetting casting resins and mixtures thereof to form a thermosetting polyester resin mixture;
   b) adding a suspending filler to the thermosetting polyester resin mixture in amounts sufficient to suspend heavy phosphorescent pigments;
   c) adding a phosphorescent pigment to the thermosetting polyester resin mixture;
   d) adding a catalyst to the thermosetting polyester resin mixture; and
   e) forming the thermosetting polyester resin mixture into the luminescent shaped article.

20. A luminescent shaped article made by the process comprising:
   a) mixing a thermosetting polyester gel coat resin with a thermosetting moldable resin selected from the group consisting of thermosetting laminating resins, thermosetting casting resins and mixtures thereof to form a thermosetting polyester resin mixture;
   b) adding a suspending filler to the thermosetting polyester resin mixture in amounts sufficient to suspend heavy phosphorescent pigments;
   c) adding a phosphorescent pigment to the thermosetting polyester resin mixture;
   d) adding a catalyst to the thermosetting polyester resin mixture; and
   e) forming the thermosetting polyester resin mixture into the luminescent shaped article.

21. The process of making the luminescent shaped article of claim 19 wherein the luminescent shaped article is reinforced with a fiberglass fabric.

22. The process of making a luminescent gel coated product comprising mixing a thermosetting polyester gel coat resin with a thermosetting moldable resin selected from the group consisting of thermosetting laminating resins, thermosetting casting resins and mixtures thereof to form a thermosetting polyester resin mixture, adding a suspending filler to the thermosetting polyester resin mixture in amounts sufficient to suspend heavy phosphorescent pigments, adding a phosphorescent pigment to the thermosetting polyester resin mixture to form a luminescent thermosetting polyester resin mixture, adding a polymerization initiator to the luminescent thermosetting resin mixture to form a catalyzed thermosetting luminescent resin mixture and applying the catalyzed thermosetting luminescent resin mixture as a gel coat to a surface of a product to make the luminescent gel coated product.

23. A luminescent gel coated product made by the process comprising mixing a thermosetting polyester gel coat resin with a thermosetting moldable resin selected from the group consisting of thermosetting laminating resins, thermosetting casting resins and mixtures thereof to form a thermosetting polyester resin mixture, adding a suspending filler to the thermosetting polyester resin mixture in amounts sufficient to suspend heavy phosphorescent pigments adding a phosphorescent pigment to the thermosetting polyester resin mixture to form a luminescent thermosetting polyester resin mixture, adding a polymerization initiator to the thermosetting resin mixture to form a catalyzed luminescent resin mixture and applying the catalyzed luminescent resin mixture as a gel coat to a surface of a product.

* * * * *